US012672528B2

(12) United States Patent
Jeong et al.

(10) Patent No.: US 12,672,528 B2
(45) Date of Patent: Jun. 30, 2026

(54) METHOD OF FABRICATING SEMICONDUCTOR DEVICE

(71) Applicant: Samsung Electronics Co., Ltd., Suwon-si (KR)

(72) Inventors: Yongchul Jeong, Suwon-si (KR); Sangjin Kim, Suwon-si (KR); Yigwon Kim, Seongnam-si (KR); Kyeongbeom Park, Suwon-si (KR); Suhyun Bark, Seongnam-si (KR); Sangshin Jang, Seoul (KR); Jinhee Jang, Seoul (KR); Cheolin Jang, Seoul (KR); Tae Min Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 527 days.

(21) Appl. No.: 17/704,465

(22) Filed: Mar. 25, 2022

(65) Prior Publication Data

US 2023/0042905 A1     Feb. 9, 2023

(30) Foreign Application Priority Data

Aug. 6, 2021     (KR) ......................... 10-2021-0104090

(51) Int. Cl.
*H01L 21/768* (2006.01)
*H10P 50/00* (2026.01)
(Continued)

(52) U.S. Cl.
CPC ........... *H10W 20/056* (2026.01); *H10P 50/73* (2026.01); *H10P 76/2041* (2026.01); *H10W 20/081* (2026.01)

(58) Field of Classification Search
CPC ........... H01L 21/76877; H01L 21/0274; H01L 21/31144; H01L 21/76802; H10W 20/056;
(Continued)

(56) References Cited

U.S. PATENT DOCUMENTS 6,171,763 B1    1/2001   Wang et al.
6,194,323 B1    2/2001   Downey et al.
(Continued)

FOREIGN PATENT DOCUMENTS

KR      2011/0117226 A    10/2011
KR      2021/0016274 A    2/2021
(Continued)

*Primary Examiner* — Jay C Kim
(74) *Attorney, Agent, or Firm* — HARNESS, DICKEY & PIERCE, P.L.C.

(57)     ABSTRACT

A method of fabricating a semiconductor device is disclosed. The method may include forming an etch-target layer, a mask layer, a blocking layer, and a photoresist layer, which are sequentially stacked on a substrate; forming a photoresist pattern, the forming the photoresist pattern including irradiating the photoresist layer with extreme ultraviolet (EUV) light; forming a mask layer, the forming the mask layer including etching the mask layer using the photoresist pattern as an etch mask; and forming a target pattern, the forming the target pattern including etching the etch-target layer using the mask pattern as an etch mask. The photoresist layer may include an organic metal oxide. The blocking layer may be a non-polar layer and may limit and/or prevent a metallic element in the photoresist layer from infiltrating into the mask layer.

19 Claims, 19 Drawing Sheets

(51) Int. Cl.
  *H10P 76/20* (2026.01)
  *H10W 20/00* (2026.01)

(58) Field of Classification Search
  CPC ............. H10W 20/081; H10W 20/427; H10W
    20/063; H10W 20/0633; H10W 20/089;
    H10W 20/435; H10P 50/73; H10P
    76/2041; H10P 76/405; H10P 50/71;
    H10P 76/204; H10P 76/4085; H10D
    84/0186; H10D 84/038; G03F 7/0042;
    G03F 7/0043; G03F 7/11; G03F 7/265;
    G03F 7/2004
  See application file for complete search history.

(56)                  References Cited

U.S. PATENT DOCUMENTS

| | | | | |
|---|---|---|---|---|
| 6,316,168 | B1 * | 11/2001 | Butt .................... | H01L 21/0276 |
| | | | | 430/323 |
| 7,241,683 | B2 * | 7/2007 | Hudson ............. | H01L 21/31144 |
| | | | | 438/945 |
| 7,297,466 | B2 * | 11/2007 | Lee ......................... | G03F 7/405 |
| | | | | 430/311 |
| 7,387,869 | B2 * | 6/2008 | Koh .................... | H01L 21/0274 |
| | | | | 430/311 |
| 7,473,377 | B2 | 1/2009 | Yamaguchi et al. | |
| 7,838,432 | B2 * | 11/2010 | Wang ................. | H01L 21/31144 |
| | | | | 438/692 |
| 7,892,981 | B2 * | 2/2011 | Jung ...................... | H10B 69/00 |
| | | | | 438/692 |
| 7,932,013 | B2 * | 4/2011 | Matsumaru ............. | G03F 7/405 |
| | | | | 430/317 |
| 8,177,990 | B2 * | 5/2012 | Mochizuki .......... | H01L 21/0338 |
| | | | | 438/743 |
| 8,278,223 | B2 * | 10/2012 | Kang ................... | H01L 21/0337 |
| | | | | 438/735 |
| 8,318,412 | B2 * | 11/2012 | Ken .................... | H10B 12/0335 |
| | | | | 430/315 |
| 8,449,785 | B2 * | 5/2013 | Kondo .............. | H01L 21/31116 |
| | | | | 216/41 |
| 8,512,582 | B2 * | 8/2013 | Kiehlbauch .......... | H10B 12/033 |
| | | | | 216/37 |
| 8,883,374 | B2 | 11/2014 | Altamirano Sanchez | |
| 9,618,846 | B2 | 4/2017 | Shamma et al. | |
| 10,468,249 | B2 | 11/2019 | Chen et al. | |
| 10,658,180 | B1 | 5/2020 | Mignot et al. | |
| 10,755,926 | B2 | 8/2020 | Arceo de la Pena et al. | |
| 10,796,912 | B2 | 10/2020 | Shamma et al. | |
| 10,978,301 | B2 * | 4/2021 | Chang ............... | H01L 21/76802 |
| 11,079,682 | B1 * | 8/2021 | Han ...................... | G03F 7/0043 |
| 11,131,919 | B2 * | 9/2021 | Xu ...................... | G03F 7/0752 |
| 11,314,168 | B2 * | 4/2022 | Tan ........................... | G03F 7/11 |
| 11,424,123 | B2 * | 8/2022 | Liu ...................... | H10P 76/4085 |
| 11,837,471 | B2 * | 12/2023 | Lutker-Lee ........ | H10P 76/2041 |
| 11,881,402 | B2 * | 1/2024 | Feng ................... | H10D 62/118 |
| 11,887,851 | B2 * | 1/2024 | Chang ............... | H01L 21/0337 |
| 11,921,427 | B2 * | 3/2024 | Weidman ............... | G03F 7/327 |
| 11,978,631 | B2 * | 5/2024 | Sun ................... | H01L 21/31144 |
| 11,988,965 | B2 * | 5/2024 | Tan ......................... | C23C 16/22 |
| 2010/0304061 | A1 | 12/2010 | Ye et al. | |
| 2020/0272045 | A1 * | 8/2020 | Felix ...................... | G03F 7/094 |
| 2020/0273705 | A1 | 8/2020 | Singh et al. | |
| 2022/0157617 | A1 * | 5/2022 | Zhou ................... | H01L 21/0228 |

FOREIGN PATENT DOCUMENTS

| | | | | | |
|---|---|---|---|---|---|
| KR | 2021/0042205 | A | | 4/2021 | |
| WO | WO 2020/190941 | | * | 9/2020 | .......... H01L 21/308 |
| WO | WO-2020/190941 | A1 | | 9/2020 | |
| WO | WO-2020/223011 | A1 | | 11/2020 | |
| WO | 2021/021279 | A1 | | 2/2021 | |

* cited by examiner

MAP

TGL

130

SUB

A

A'

D3

D1

METHOD OF FABRICATING SEMICONDUCTOR DEVICE

CROSS-REFERENCE TO RELATED APPLICATIONS

This U.S. non-provisional patent application claims priority under 35 U.S.C. § 119 to Korean Patent Application No. 10-2021-0104090, filed on Aug. 6, 2021, in the Korean Intellectual Property Office, the entire contents of which are hereby incorporated by reference.

BACKGROUND

The present disclosure relates to a method of fabricating a semiconductor device, and in particular, to a method of fabricating a semiconductor device using an extreme ultraviolet (EUV) lithography process.

Due to their small-sized, multifunctional, and/or low-cost characteristics, semiconductor devices may be important elements in the electronics industry. The semiconductor devices may be classified into a memory device for storing data, a logic device for processing data, and a hybrid device for performing various functions.

As the electronic industry advances, there may be an increasing demand for a semiconductor device with a higher integration density. Thus, a process margin in an exposing process, which is performed to define fine patterns, is being reduced, and this may lead to a difficulty in realizing a semiconductor device. In addition, as the electronic industry advances, a demand for a high-performance semiconductor device may increase. Many studies are being conducted to meet the demand for semiconductor devices with higher integration density and operation speed.

SUMMARY

An embodiment of inventive concepts provides a method of forming a desired pattern when a semiconductor device is fabricated.

According to an embodiment of inventive concepts, a method of fabricating a semiconductor device may include forming an etch-target layer, a mask layer, a blocking layer, and a photoresist layer, which are sequentially stacked on a substrate; forming a photoresist pattern, the forming the photoresist pattern including irradiating the photoresist layer with extreme ultraviolet (EUV) light; forming a target pattern, the forming the target pattern including etching the mask layer using the photoresist pattern as an etch mask; and forming a target pattern, the forming the target pattern including etching the etch-target layer using the mask pattern as an etch mask. The photoresist layer may include an organic metal oxide. The blocking layer may be a non-polar layer and may limit and/or prevent a metallic element in the photoresist layer from infiltrating into the mask layer.

According to an embodiment of inventive concepts, a method of fabricating a semiconductor device may include forming an etch-target layer, a mask layer, a blocking layer, and a photoresist layer, which are sequentially stacked on a substrate; forming a photoresist pattern, the forming the photoresist pattern including irradiating the photoresist layer with extreme ultraviolet (EUV) light; forming a silicon layer on a surface of the photoresist pattern, the forming the silicon layer including providing a silicon precursor on the silicon layer including providing a silicon precursor on the surface of the photoresist pattern, the silicon precursor selectively reacting with the surface of the photoresist pattern such that the silicon layer forms selectively on the surface of the photoresist pattern; forming a mask pattern, the forming the mask pattern including etching the mask layer using the photoresist pattern as an etch mask; and forming a target pattern. The forming the target pattern may include etching the etch-target layer using the mask pattern as an etch mask. The photoresist layer may include an organic metal oxide.

According to an embodiment of inventive concepts, a method of fabricating a semiconductor device may include forming an FEOL layer including a plurality of transistors on a substrate; sequentially stacking an etch-target layer, a mask layer, a blocking layer, and a photoresist layer on the FEOL layer; forming a photoresist pattern, the forming the photoresist pattern including irradiating the photoresist layer with extreme ultraviolet (EUV) light; forming a mask pattern, the forming the mask pattern including etching the mask layer using the photoresist pattern as an etch mask; forming an interconnection line, the forming the interconnection line including etching the etch-target layer using the mask pattern as an etch mask. The blocking layer may limit and/or prevent a metallic element in the photoresist layer from infiltrating into the mask layer. The interconnection line may include a first interconnection line and a second interconnection line, which may be arranged side by side along a first interconnection track. A smallest distance between a first end of the first interconnection line and a second end of the second interconnection line may range from 10 nm to 30 nm.

BRIEF DESCRIPTION OF THE DRAWINGS

FIGS. 2 to 8 are sectional views illustrating a method of forming a target pattern according to an embodiment of inventive concepts.

FIG. 11 is a sectional view illustrating a process, in which a metallic element is diffused from a photoresist layer, according to an embodiment of inventive concepts.

FIG. 12 is a plan view illustrating a semiconductor device according to an embodiment of inventive concepts.

FIGS. 16 and 18 are sectional views taken along lines A-A' of FIGS. 15 and 17, respectively.

DETAILED DESCRIPTION

Figure 1:
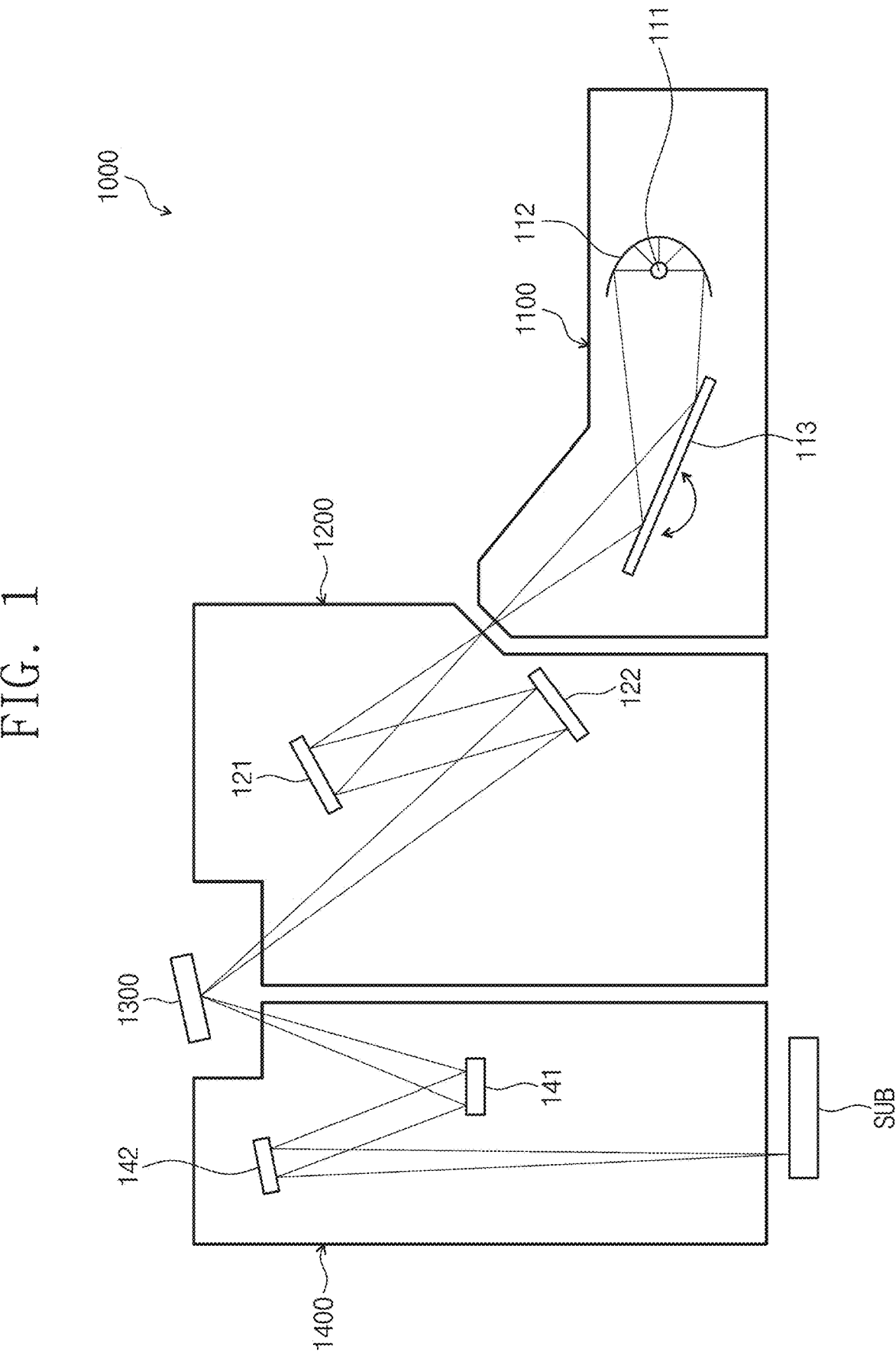
FIG. 1 is a diagram illustrating an extreme ultraviolet lithography system.

FIG. 1 is a diagram illustrating an extreme ultraviolet lithography system.

Referring to FIG. 1, an extreme ultraviolet (EUV) lithography system 1000 may include a beam shaping system 1100, an illumination system 1200, a photomask 1300, and a projection system 1400. The beam shaping system 1100, the illumination system 1200, and the projection system 1400 may be disposed in respective housings. In an embodiment, the entirety or portion of the beam shaping system 1100 may be incorporated into the illumination system 1200.

The beam shaping system 1100 may include a light source 111, a collector 112, and a monochromator 113.

The light source 111 may be a laser plasma source, a gas discharging source, or a synchrotron-based radiation source. Light, which is generated by the light source 111, may have a wavelength of about 5 nm to about 20 nm. The illumination system 1200 and the projection system 1400 may be configured to be operated within the wavelength range. An EUV light, which is emitted from the light source 111, may be focused by the collector 112. The monochromator 113 may be configured to filter out unwanted wavelengths of light.

The EUV light whose wavelength and spatial distribution are adjusted in the beam shaping system 1100 may be incident into the illumination system 1200. FIG. 1 illustrates an example in which the illumination system 1200 includes two mirrors 121 and 122. However, the number of the mirrors 121 and 122 is not limited to this example. Each of the mirrors 121 and 122 may be a multilayered mirror.

Due to the mirrors 121 and 122 in the illumination system 1200, the EUV light may be incident into the photomask 1300. Although not shown, the photomask 1300 may include specific patterns to be copied onto a substrate SUB. The incident EUV light may be reflected by the specific patterns of the photomask 1300. The reflected portion of the EUV light may be projected onto the substrate SUB, which is coated with a photoresist composite, through the projection system 1400. In other words, the photomask 1300 may be configured to reflect the EUV light.

The projection system 1400 may be configured to irradiate the EUV light, which is reflected by the photomask 1300, onto the substrate SUB coated with the photoresist composite. A patterned structure may be imaged in the photoresist composite by the EUV light irradiated onto the substrate SUB. FIG. 1 illustrates an example in which the projection system 1400 includes two mirrors 141 and 142. However, the number of the mirrors 141 and 142 is not limited to this example. Each of the mirrors 141 and 142 may be a multilayered mirror.

Figure 2:
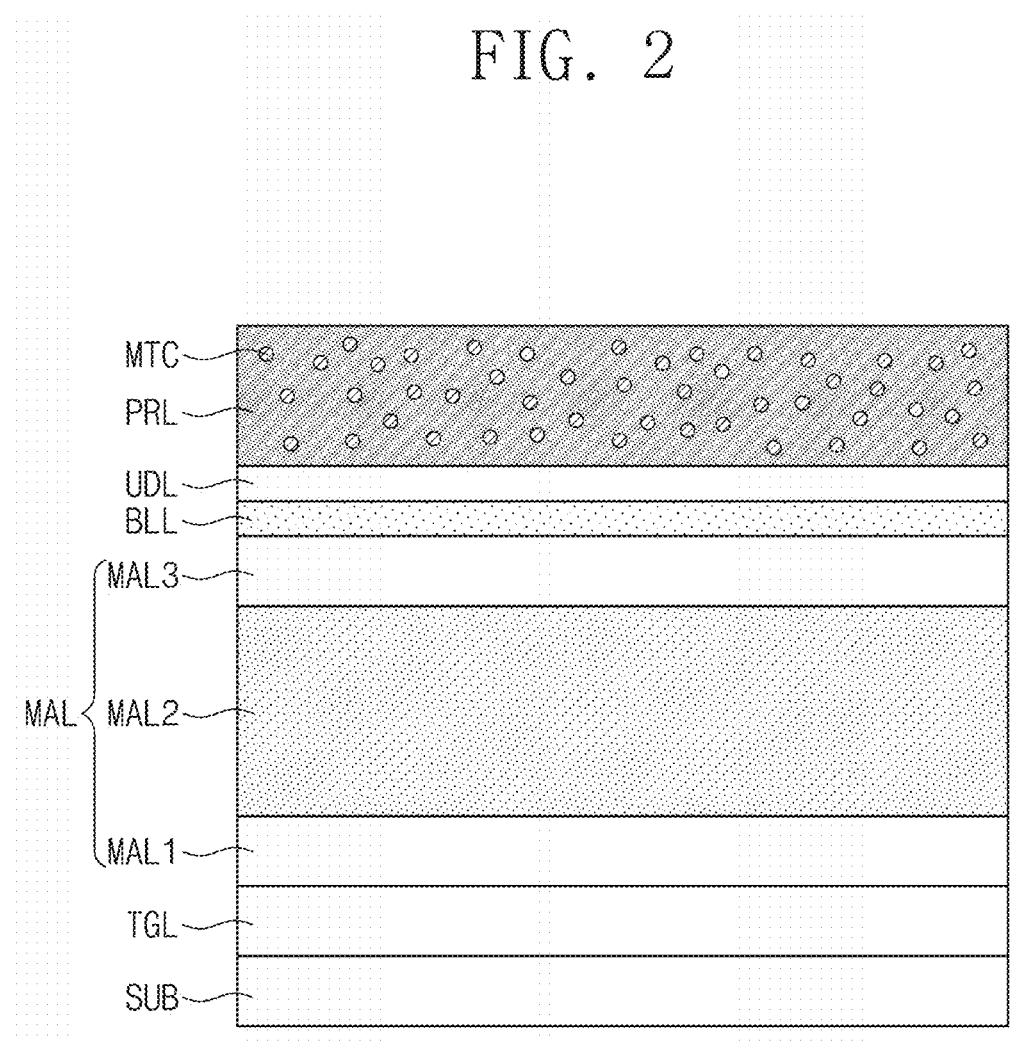

FIGS. 2 to 8 are sectional views illustrating a method of forming a target pattern according to an embodiment of inventive concepts. Referring to FIG. 2, an etch-target layer TGL may be formed on the substrate SUB. In an embodiment, the substrate SUB may be a silicon substrate, a germanium substrate, or a silicon-germanium substrate. The substrate SUB may be a semiconductor wafer. The etch-target layer TGL may be formed of or include at least one of conductive or insulating materials. The conductive material may include at least one of semiconductor materials (e.g., doped silicon and doped germanium), conductive metal nitrides (e.g., titanium nitride and tantalum nitride), metallic materials (e.g., tungsten, titanium, and tantalum), or metal-semiconductor compounds (e.g., tungsten silicide, cobalt silicide, and titanium silicide). The insulating material may include at least one of silicon oxide, silicon nitride, or silicon oxynitride.

A mask layer MAL, a blocking layer BLL, and an under layer UDL, which are sequentially stacked, may be formed on the etch-target layer TGL. The mask layer MAL may include a first mask layer MAL1, a second mask layer MAL2, and a third mask layer MAL3, which are sequentially stacked. The second mask layer MAL2 may be interposed between the first and third mask layers MAL1 and MAL3. A thickness of the second mask layer MAL2 may be larger than a thickness of each of the first and third mask layers MALI and MAL3.

The second mask layer MAL2 may include a spin-on-hardmask (SOH) layer, a spin-on-carbon (SOC) layer, or an amorphous carbon layer. Each of the first and third mask layers MAL1 and MAL3 may include a silicon layer, a silicon oxide layer, a silicon nitride layer, a silicon oxynitride layer, or a metal layer. The metal layer may include a titanium layer, a tungsten layer, a titanium oxide layer, or a titanium nitride layer. The silicon layer may be an amorphous silicon layer, a single-crystalline silicon layer, or a poly-crystalline silicon layer. In an embodiment, the first and third mask layers MAL1 and MAL3 may be formed of or include the same material. In another embodiment, the first and third mask layers MALI and MAL3 may be formed of or include different materials from each other.

The blocking layer BLL may be directly formed on a top surface of the third mask layer MAL3. The blocking layer BLL may be formed of or include a material which is formed of at least one of elements in group 14. That is, the blocking layer BLL may include at least one element which is selected from the group consisting of carbon (C), silicon (Si), germanium (Ge), and tin (Sn).

The blocking layer BLL may be formed of or include at least one of SiC, amorphous silicon, SiOC whose oxygen content is smaller than 20 at %, SiCH, or borophosphosilicate glass (BPSG). The blocking layer BLL may be formed by a deposition process (e.g., a CVD process) or a spin coating process. For example, the blocking layer BLL may be formed of or include SiC.

Since the blocking layer BLL contains elements (e.g., Si and C) in the same group, the blocking layer BLL may be a non-polar layer. By contrast, since the third mask layer MAL3 contains different elements (e.g., Si and N) in different groups, the third mask layer MAL3 may be polar, compared with the blocking layer BLL. The blocking layer BLL may limit and/or prevent a metallic element MTC, which is contained in a photoresist layer PRL to be described below, from being infiltrated or diffused into the third mask layer MAL3. Since the blocking layer BLL serves as the non-polar layer, the metallic element MTC may hardly pass through the blocking layer BLL.

The under layer UDL may be used to attach the photoresist layer PRL to the blocking layer BLL. The under layer UDL may contain an organic polymer (e.g., novolac-based organic polymer) capable of improving an attaching property to the photoresist layer PRL.

The photoresist layer PRL for an EUV lithography process may be formed on the under layer UDL. The photoresist layer PRL may be formed of or include a resist material, which can be exposed and developed by EUV light. In an embodiment, the photoresist layer PRL may include a metallic photoresist, not a chemically amplified resist (CAR) including the organic polymer.

The photoresist layer PRL may be formed of or include an organic metal, an organic metal compound, or an inorganic metal compound. The photoresist layer PRL may be formed of or include an organometal oxide. That is, the photoresist layer PRL may be provided to contain the metallic element MTC.

In an embodiment, the photoresist layer PRL may include organotin oxide. Here, the metallic element MTC may be tin (Sn). For example, the photoresist layer PRL may be formed of or include at least one of alkyl tin oxide, alkoxy tin oxide, or amido alkyl tin oxide. The resist material containing the organotin oxide may be commercially obtained from Inpria Corporation. The photoresist layer PRL may be formed to have a thickness of 10 nm to 100 nm. In an embodiment, the photoresist layer PRL may be formed to have a thickness of 10 nm to 30 nm.

In an embodiment, the photoresist layer PRL may be formed by a spin coating method. In another embodiment, the photoresist layer PRL may be formed by a deposition process (e.g., CVD and/or ALD) using an organic metal precursor.

Figure 3:
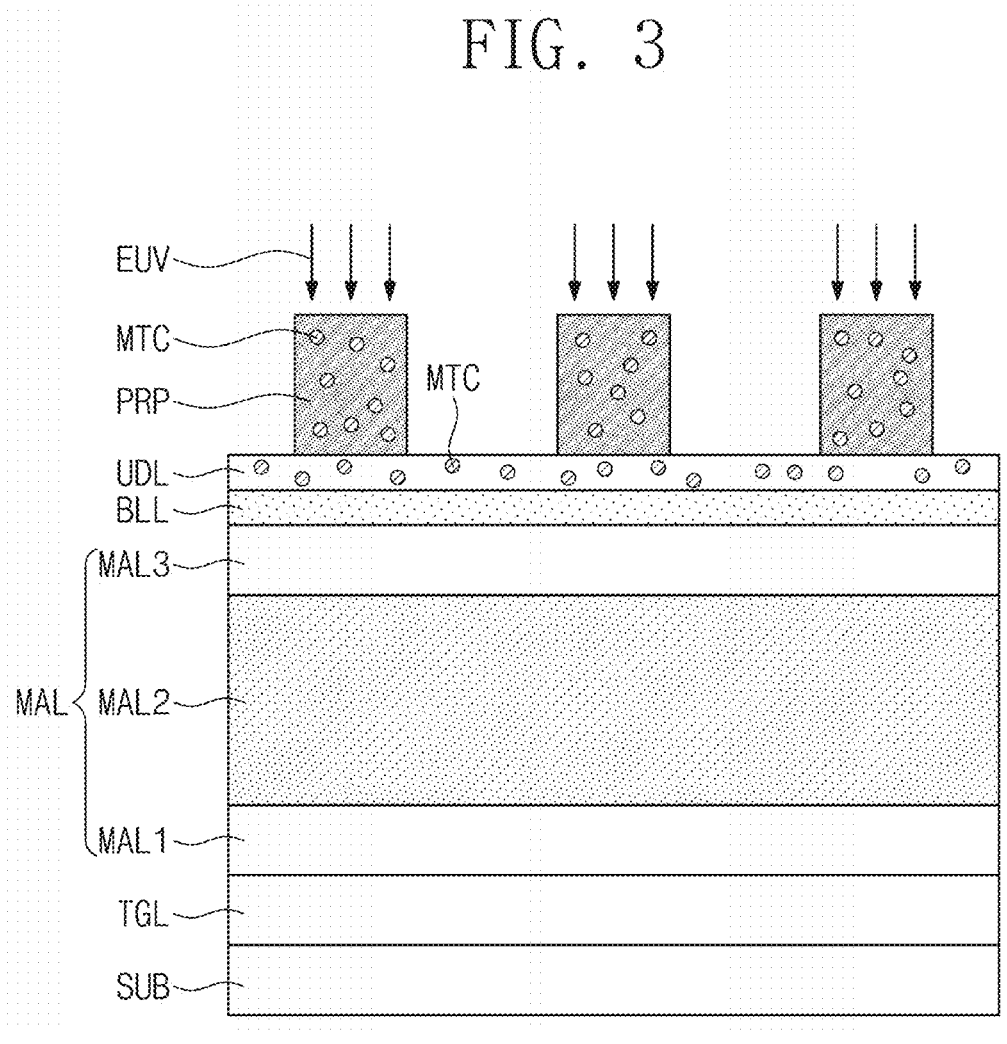

Referring to FIG. 3, an exposing process using an extreme ultraviolet (EUV) light may be performed on the photoresist layer PRL. The EUV lithography system previously described with reference to FIG. 1 may be used to irradiate the photoresist layer PRL with the EUV light. Due to the photomask 1300 of FIG. 1, only first portions of the photoresist layer PRL may be selectively irradiated with the EUV light. Second portions of the photoresist layer PRL may not be irradiated with the EUV light.

In an embodiment, as a result of the reaction with the EUV light, an organic metal oxide in the first portion of the photoresist layer PRL may be changed to a metal oxide. That is, as a result of the reaction with the EUV light, carbon and hydrogen atoms may be removed from the first portion of the photoresist layer PRL.

In an embodiment, the EUV light may have a wavelength ranging from 4 nm and 124 nm, and in particular, a wavelength ranging from 4 nm and 20 nm and may be, for example, an ultraviolet light having a wavelength of 13.5 nm. The EUV light may have an energy of 6.21 eV to 124 eV and, in particular, of 90 eV to 95 eV.

In general, since, for the EUV light, the number of photons per unit volume is very small, a portion of the photoresist layer PRL may not sufficiently react with the EUV light. This may lead to a defect in an EUV lithography process.

Since a metallic photoresist, not a chemically amplified resist (CAR), is used for the photoresist layer PRL according to an embodiment of inventive concepts, the photoresist layer PRL may be formed to a very small thickness. In addition, the metallic photoresist may have high absorptivity to the EUV light, compared with the chemically amplified resist (CAR). Accordingly, the photoresist layer PRL may not fully react with the EUV light, and this may make it possible to limit and/or prevent the afore-described process defect.

Photoresist patterns PRP may be formed by developing the photoresist layer PRL that is exposed to the EUV light. When viewed in a plan view, each of the photoresist patterns PRP may have a line or island shape, but inventive concepts are not limited to this example.

In an embodiment, the photoresist layer PRL may be a negative-type photoresist layer. In this case, a portion of the photoresist layer PRL, which reacts with the EUV light and forms the metal oxide, may be left as the photoresist pattern PRP, and other portions may be removed by the developing process. In an embodiment, the photoresist layer PRL may be a positive-type photoresist layer, but inventive concepts are not limited to this example.

According to an embodiment of inventive concepts, a soft-baking process may be performed on the photoresist layer PRL, before the exposing process. According to an embodiment of inventive concepts, a post exposure baking (PEB) process may be performed on the photoresist layer PRL, after the exposing process. That is, a baking process may be performed on the photoresist layer PRL at least once. The metallic element MTC in the photoresist layer PRL may be infiltrated or diffused into the under layer UDL by the baking process. Due to the blocking layer BLL, which is the non-polar layer, the metallic element MTC may not be infiltrated into the third mask layer MAL3.

Figure 4:
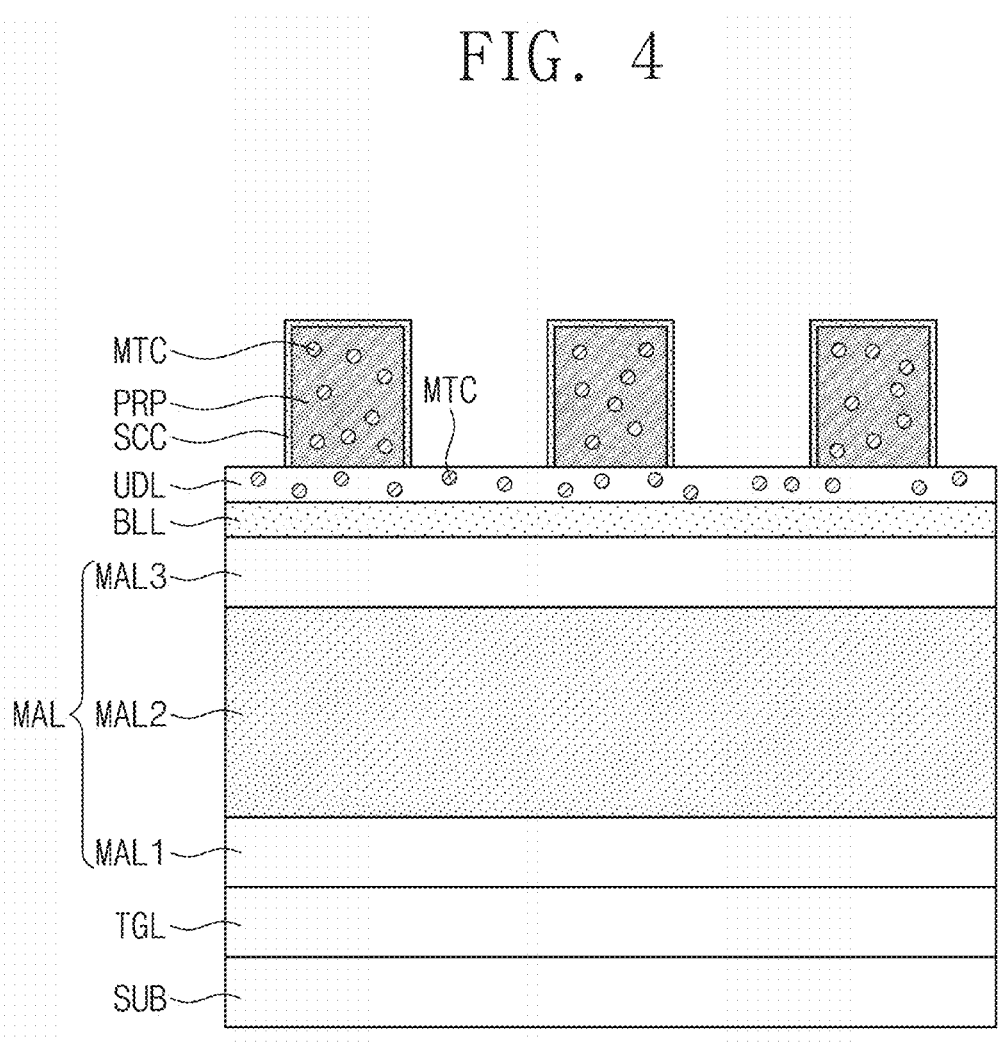

Referring to FIG. 4, a capping layer SCC may be formed on each of the photoresist patterns PRP. The capping layer SCC may be selectively formed on a surface of the photoresist pattern PRP, but not on the under layer UDL. The capping layer SCC may effectively protect the photoresist pattern PRP, during a subsequent etching process. For example, the capping layer SCC may be formed of or include silicon (Si).

In detail, the photoresist pattern PRP may be formed of or include metal oxide (e.g., tin oxide). The capping layer SCC may be formed through a process of reducing the metal oxide material on the surface of the photoresist pattern PRP. For example, the formation of the capping layer SCC may include providing a silicon precursor (e.g., silicon tetrachloride) and hydrogen ($H_2$) on the photoresist pattern PRP and forming a silicon layer on the photoresist pattern PRP through reduction of a surface of the photoresist pattern PRP. The capping layer SCC may include the silicon layer. The photoresist pattern PRP according to the present embodiment may provide a silicon seed for forming the capping layer SCC.

The silicon tetrachloride may preferentially react with the photoresist pattern PRP, which is made of the metal oxide material, and thus, a silicon layer may be selectively formed on the surface of the photoresist pattern PRP. Meanwhile, since the under layer UDL includes organic polymer, the silicon tetrachloride may not substantially react with a surface of the under layer UDL. Accordingly, the silicon layer may not be formed on the under layer UDL.

Figure 5:
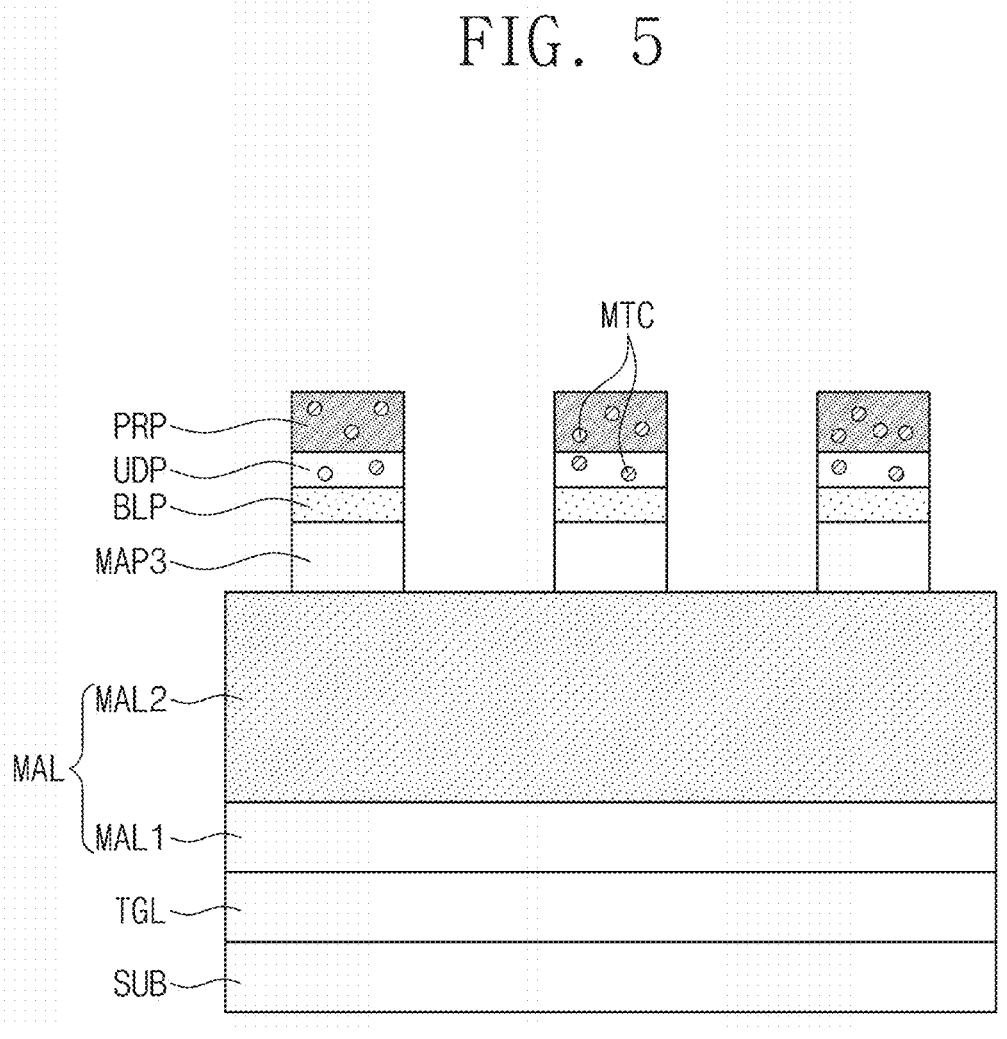

Referring to FIG. 5, a lower pattern UDP, a blocking pattern BLP, and a third mask pattern MAPS may be formed by etching the under layer UDL, the blocking layer BLL, and the third mask layer MAL3, respectively, using the photoresist pattern PRP as an etch mask.

According to an embodiment of inventive concepts, as described above, due to the blocking layer BLL, the metallic element MTC may be limited and/or prevented from being diffused into the third mask layer MAL3. The third mask layer MAL3, which does not contain the metallic element MTC, may be easily etched, and thus, the third mask layer MAL3 may be fully patterned by the etching process. Portions of the second mask layer MAL2 between adjacent ones of the third mask patterns MAP3 may be exposed.

The capping layer SCC may protect the photoresist pattern PRP, during the etching process. In detail, the capping layer SCC may protect the photoresist pattern PRP in the etching process of forming the third mask pattern MAP3 from the third mask layer MAL3. Accordingly, it may be possible to limit and/or prevent a process failure, in which at least a portion of the photoresist pattern PRP is removed before the formation of the third mask pattern MAP3.

In an embodiment, the capping layer SCC may be formed again on the photoresist pattern PRP after the etching of the under layer UDL, and the capping layer SCC may be formed again on the photoresist pattern PRP after the etching of the blocking layer BLL. This is because, due to the very small thickness of the capping layer SCC, the capping layer SCC may be fully removed during the etching process on each layer.

Figure 6:
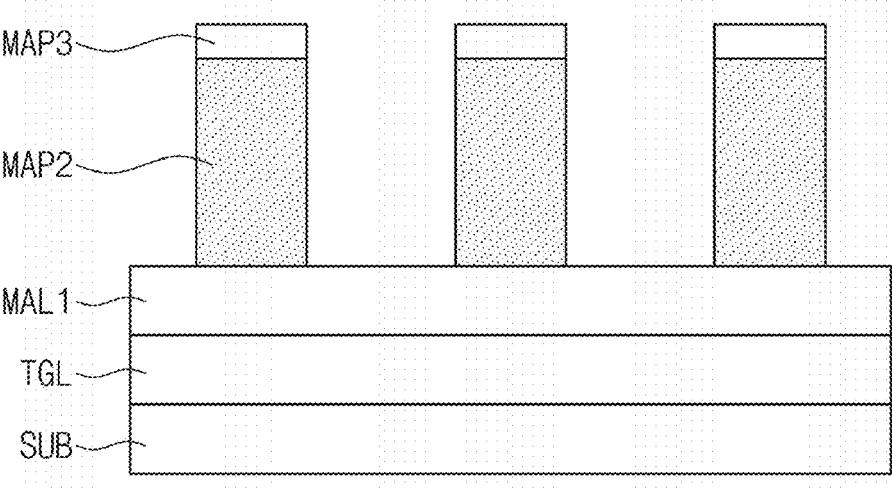

Referring to FIG. 6, a second mask pattern MAP2 may be formed by etching the second mask layer MAL2 using the third mask pattern MAP3 as an etch mask. The photoresist pattern PRP, the lower pattern UDP, and the blocking pattern BLP may be removed before or during the etching process of the second mask layer MAL2.

Figure 7:
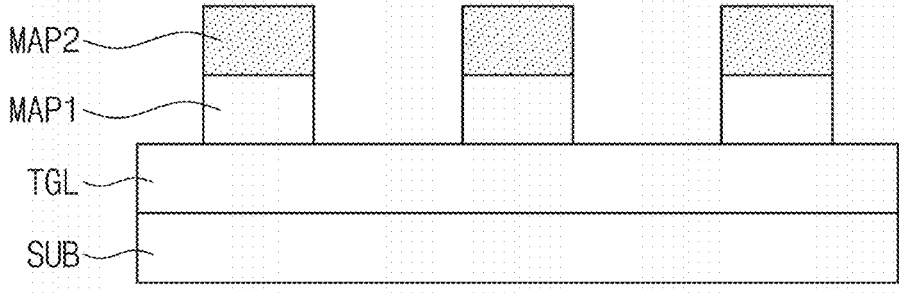

Referring to FIG. 7, a first mask pattern MAP1 may be formed by etching the first mask layer MAL1 using the second mask pattern MAP2 as an etch mask. The third mask pattern MAP3 may be removed before or during the etching process of the first mask layer MAL1.

Figure 8:
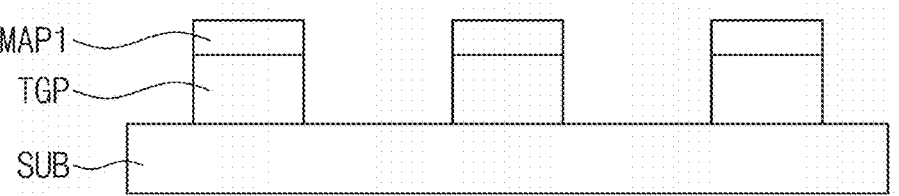

Referring to FIG. 8, a target pattern TGP may be formed by etching the etch-target layer TGL using the first mask pattern MAP1 as an etch mask. The second mask pattern MAP2 may be removed before or during the etching process of the etch-target layer TGL. After the formation of the target pattern TGP, the first mask pattern MAP1 may be selectively removed.

When viewed in a plan view, the target pattern TGP of FIG. 8 may be formed to be substantially overlapped with the photoresist pattern PRP of FIG. 3. That is, the target pattern TGP may be a result which is formed in the etch-target layer TGL using the photoresist pattern PRP of FIG. 3. A size (e.g., width) of the target pattern TGP may be equal or similar to a size of the corresponding photoresist pattern PRP. In an embodiment, the size of the target pattern TGP may be slightly increased, compared with the size of the photoresist pattern PRP.

In a comparative example, a multi-patterning technique (MPT) using two or more photomasks may be used to form fine patterns having a small pitch on a wafer. By contrast, in the case where the EUV lithography process according to an embodiment of inventive concepts is performed, it may be possible to form a plurality of target patterns TGP with a small pitch using a single photomask (e.g., see 130 of FIG. 1).

For example, the minimum pitch between the target patterns TGP, which are formed by the EUV lithography process according to the present embodiment, may be smaller than 45 nm. That is, by performing the EUV lithography process according to the present embodiment, it may be possible to accurately form the fine target patterns TGP, without a multi-patterning technique.

Figure 9:
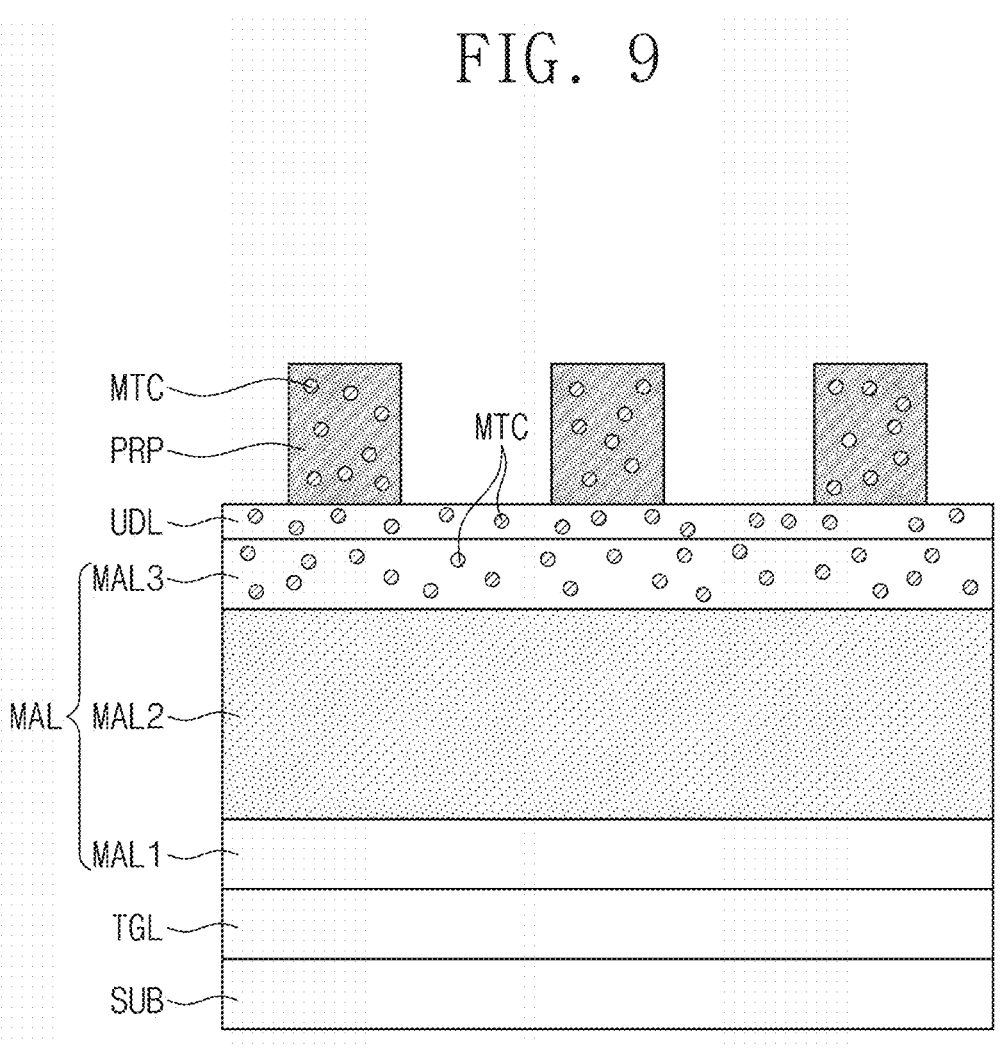
FIGS. 9 and 10 are sectional views illustrating a method of forming a target pattern according to a comparative example.
Figure 10:
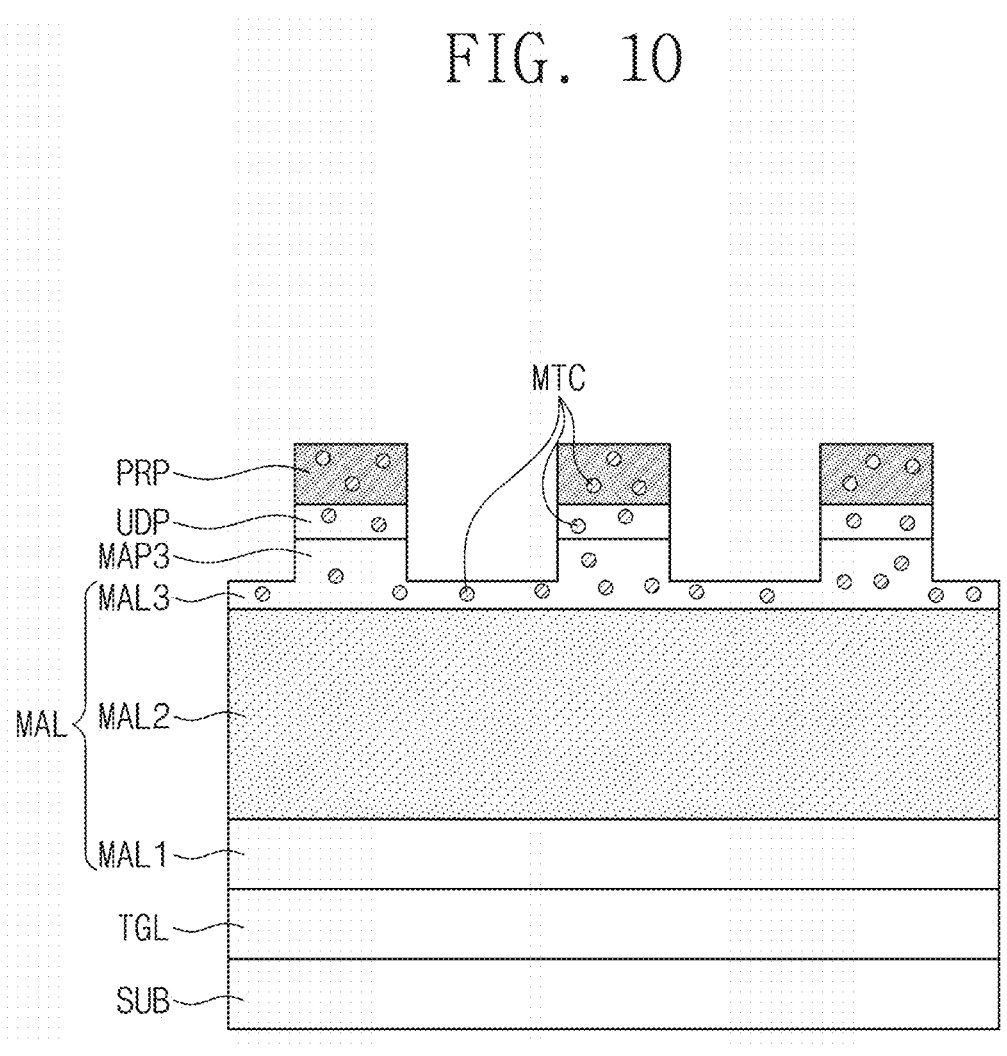

FIGS. 9 and 10 are sectional views illustrating a method of forming a target pattern according to a comparative example. Referring to FIG. 9, the blocking layer BLL may be omitted, unlike the embodiment previously described with reference to FIG. 3. That is, the under layer UDL may be directly formed on the third mask layer MAL3.

Due to the afore-described baking process on the photoresist layer PRL, the metallic element MTC in the photoresist layer PRL may pass through the under layer UDL and may be infiltrated or diffused into the third mask layer MAL3. Since the blocking layer BLL is omitted, the metallic element MTC may be easily diffused into the third mask layer MAL3 having a polarity property, without any limitation.

Referring to FIG. 10, the third mask layer MAL3 may be etched using the photoresist pattern PRP as an etch mask. Since, unlike the afore-described structure of FIG. 5, the third mask layer MAL3 contains the metallic element MTC, the third mask layer MAL3 may have an increased etching resistant property in the etching process. Accordingly, the third mask pattern MAPS may not be formed in a desired shape; for example, a lower portion of the third mask layer MAL3 may be left after the etching process. The second mask layer MAL2 may not be exposed by the remaining portion of the third mask layer MAL3. This may lead to a severe process failure in which the shape of the photoresist pattern PRP is not copied onto the etch-target layer TGL.

By contrast, according to an embodiment of inventive concepts, the non-polar blocking layer BLL may be provided to limit and/or prevent diffusion of the metallic element MTC in the photoresist pattern PRP. The blocking layer BLL may limit and/or prevent the metallic element MTC from being diffused into the mask layer MAL. Accordingly, it may be possible to limit and/or prevent a process failure (e.g., an insufficient patterning of the third mask layer MAL3 shown in FIGS. 9 and 10) and to improve reliability of the semiconductor device.

In an EUV lithography process according to an embodiment of inventive concepts and a method of forming a target pattern, the structure of layers, which are interposed between the etch-target layer TGL and the photoresist layer PRL, may be variously modified from the example of FIG. 2. However, according to an embodiment of inventive concepts, at least one blocking layer BLL, which is used to limit and/or prevent the diffusion of the metallic element MTC, may be provided between the etch-target layer TGL and the photoresist layer PRL.

In an embodiment, among the stacked layers shown in FIG. 2, the first mask layer MAL1 may be omitted. In another embodiment, among the stacked layers shown in FIG. 2, the first and third mask layers MAL1 and MAL3 may be omitted. In other embodiment, among the stacked layers shown in FIG. 2, the first mask layer MAL1, the third mask layer MAL3, and the under layer UDL may be omitted. In still other embodiment, among the stacked layers shown in FIG. 2, the first mask layer MAL1, the second mask layer MAL2, the third mask layer MAL3, and the under layer UDL may be omitted.

Figure 11:
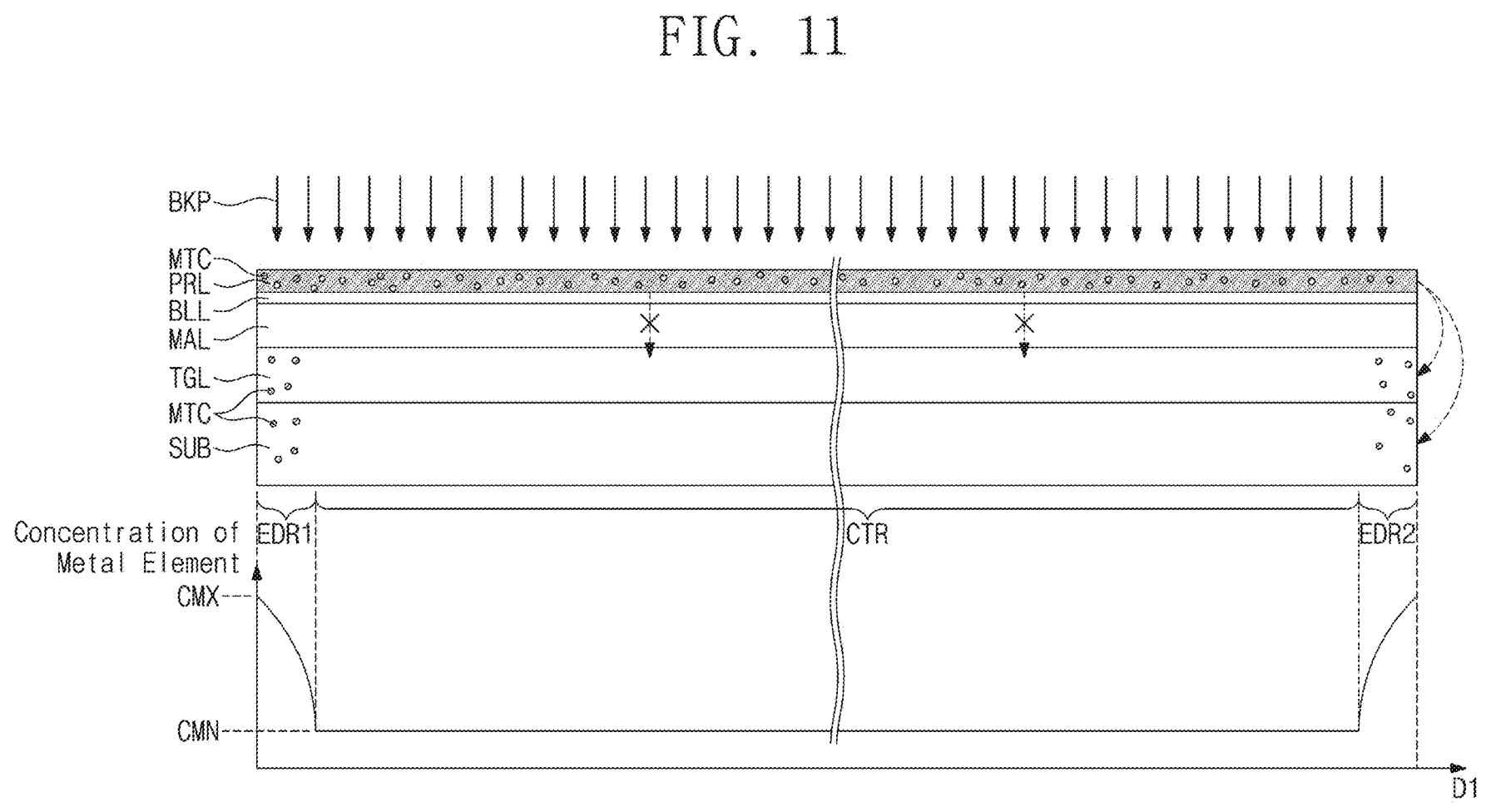

FIG. 11 is a sectional view illustrating a process, in which a metallic element is diffused from a photoresist layer, according to an embodiment of inventive concepts. Referring to FIG. 11, the etch-target layer TGL, the mask layer MAL, the blocking layer BLL, and the photoresist layer PRL may be sequentially formed on the substrate SUB (e.g., a semiconductor wafer), as described with reference to FIG. 2. The photoresist layer PRL may contain the metallic element MTC.

A baking process BKP may be performed on the photoresist layer PRL at least one time. In this case, heat may be supplied to the photoresist layer PRL, and thus, the metallic element MTC in the photoresist layer PRL may be diffused to the outside.

The substrate SUB may include edge regions EDR1 and EDR2 and a center region CTR. The edge regions EDR1 and EDR2 may be a peripheral region of a wafer and may enclose the center region CTR. The edge regions EDR1 and EDR2 may be exposed to the outside of the wafer. In the sectional view of the substrate SUB illustrated in FIG. 11, the edge regions EDR1 and EDR2 may include a first edge region EDR1 and a second edge region EDR2 which are located at both sides of the center region CTR. That is, the center region CTR may be defined between the first edge region EDR1 and the second edge region EDR2.

The metallic element MTC in the photoresist layer PRL, which is placed on the center region CTR of the substrate SUB, may not be diffused into the substrate SUB by the blocking layer BLL. However, on the first and second edge regions EDR1 and EDR2 of the substrate SUB, the metallic element MTC may be diffused into the substrate SUB through a sidewall of the wafer. That is, the first and second edge regions EDR1 and EDR2 of the substrate SUB may contain the diffused metallic element MTC. However, the center region CTR of the substrate SUB may not contain substantially the metallic element MTC.

FIG. 11 illustrates a concentration profile of the metallic element MTC in a first direction D1 throughout the substrate SUB (e.g., from the first edge region EDR1 to the second edge region EDR2). In the first edge region EDR1, the concentration of the metallic element MTC may be decreased from the maximum value CMX with decreasing distance to the center region CTR. The concentration of the metallic element MTC may reach the minimum value CMN in the center region CTR. In an embodiment, the minimum value CMN may be a very small value that is close to zero or cannot be measured by the conventional method. In the second edge region EDR2, the concentration of the metallic element MTC may be increased to reach the maximum value CMX. The concentration of the metallic element MTC in the first and second edge regions EDR1 and EDR2 of the substrate SUB may range from $1E9/cm^3$ to $1E11/cm^3$. That is, the maximum value CMX may be about $1E11/cm^3$.

Similar to that in the substrate SUB, the metallic element MTC may be diffused into the etch-target layer TGL. In detail, the etch-target layer TGL on the first and second edge regions EDR1 and EDR2 may contain the diffused metallic element MTC. However, the etch-target layer TGL on the center region CTR may not contain substantially the metallic element MTC. A concentration of the metallic element MTC in the etch-target layer TGL and its profile may be substantially equal to that in the concentration profile of the substrate SUB previously described with reference to FIG. 11.

Figure 12:
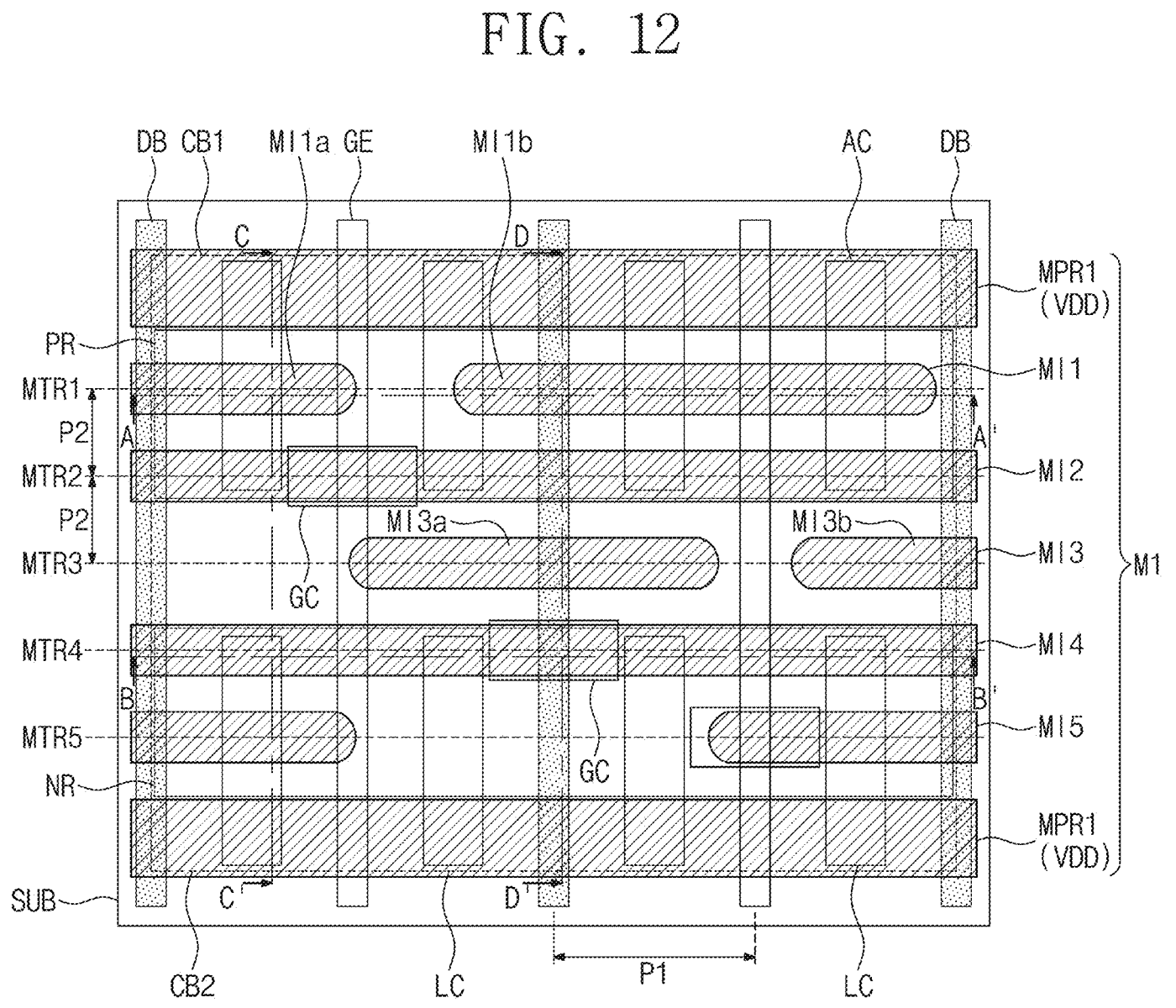

FIG. 12 is a plan view illustrating a semiconductor device according to an embodiment of inventive concepts. FIGS. 13A to 13D are sectional views taken along lines A-A', B-B', C-C', and D-D' of FIG. 12, respectively.

Referring to FIGS. 12 and 13A to 13D, a logic cell LC may be provided on the substrate SUB. The substrate SUB may be a semiconductor substrate, which is made of silicon, germanium, or silicon-germanium, or a substrate, which is made of a compound semiconductor material. As an example, the substrate SUB may be a silicon wafer.

Logic transistors constituting a logic circuit may be disposed on the logic cell LC. The logic cell LC may include a PMOSFET region PR and an NMOSFET region NR. The PMOSFET and NMOSFET regions PR and NR may be spaced apart from each other in the first direction D1.

A first active pattern AP1 and a second active pattern AP2 may be defined by a trench TR, which is formed in an upper portion of the substrate SUB. The first and second active patterns AP1 and AP2 may be provided on the PMOSFET and NMOSFET regions PR and NR, respectively. The first and second active patterns AP1 and AP2 may be extended in a second direction D2. The first and second active patterns AP1 and AP2 may be vertically-protruding portions of the substrate SUB.

A device isolation layer ST may be provided to fill the trench TR. A device isolation layer ST may include a silicon oxide layer. The device isolation layer ST may not cover first and second channel patterns CH1 and CH2 to be described below.

The first channel pattern CH1 may be provided on the first active pattern APE The second channel pattern CH2 may be provided on the second active pattern AP2. Each of the first and second channel patterns CH1 and CH2 may include a first semiconductor pattern SP1, a second semiconductor pattern SP2, and a third semiconductor pattern SP3, which are sequentially stacked. The first to third semiconductor patterns SP1, SP2, and SP3 may be spaced apart from each other in a vertical direction (e.g., a third direction D3).

Each of the first to third semiconductor patterns SP1, SP2, and SP3 may be formed of or include at least one of silicon (Si), germanium (Ge), or silicon-germanium (SiGe). In an embodiment, each of the first to third semiconductor patterns SP1, SP2, and SP3 may be formed of or include crystalline silicon.

A plurality of first source/drain patterns SD1 may be provided on the first active pattern AP1. A plurality of first recesses RS1 may be formed in an upper portion of the first active pattern AP1. The first source/drain patterns SD1 may be provided in the first recesses RS1, respectively. The first source/drain patterns SD1 may be impurity regions of a first conductivity type (e.g., p-type). The first channel pattern CH1 may be interposed between each pair of the first source/drain patterns SD1. In other words, each pair of the first source/drain patterns SD1 may be connected to each other by the stacked first to third semiconductor patterns SP1, SP2, and SP3.

A plurality of second source/drain patterns SD2 may be provided on the second active pattern AP2. A plurality of second recesses RS2 may be formed in an upper portion of the second active pattern AP2. The second source/drain patterns SD2 may be provided in the second recesses RS2, respectively. The second source/drain patterns SD2 may be impurity regions of a second conductivity type (e.g., n-type). The second channel pattern CH2 may be interposed between each pair of the second source/drain patterns SD2. In other words, the pair of the second source/drain patterns SD2 may be connected to each other by the stacked first to third semiconductor patterns SP1, SP2, and SP3.

The first and second source/drain patterns SD1 and SD2 may be epitaxial patterns, which are formed by a selective epitaxial growth (SEG) process. As an example, each of the first and second source/drain patterns SD1 and SD2 may have a top surface that is located at substantially the same level as a top surface of the third semiconductor pattern SP3. However, in an embodiment, the top surface of each of the first and second source/drain patterns SD1 and SD2 may be higher than the top surface of the third semiconductor pattern SP3.

The first source/drain patterns SD1 may be formed of or include a semiconductor material (e.g., SiGe) whose lattice constant is larger than a lattice constant of the semiconductor material of the substrate SUB. Accordingly, each pair of the first source/drain patterns SD1 may exert a compressive stress on the first channel pattern CH1 therebetween. In an embodiment, the second source/drain patterns SD2 may be formed of or include the same semiconductor material (e.g., Si) as the substrate SUB.

Figure 13A:
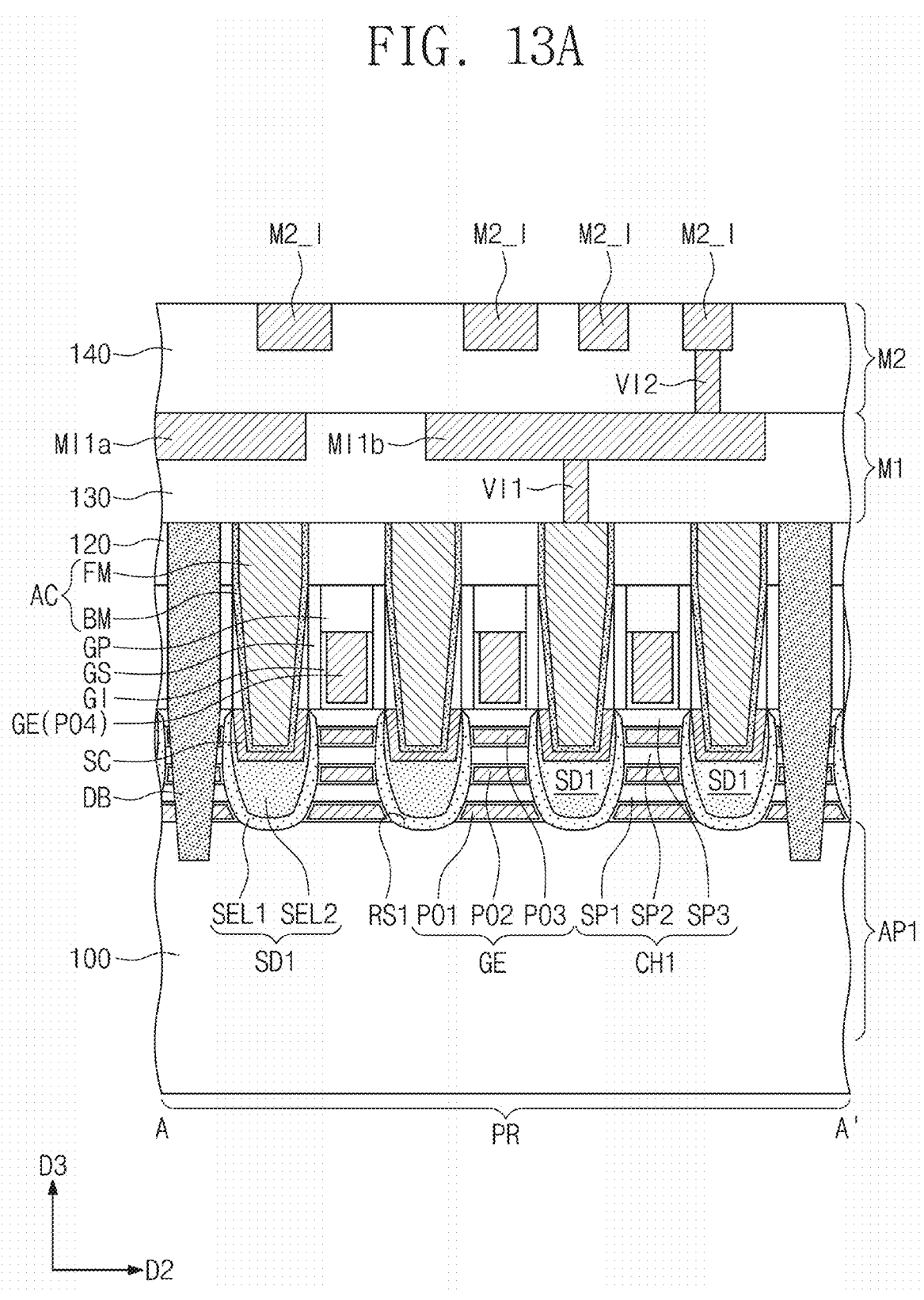
FIGS. 13A to 13D are sectional views taken along lines A-A', B-B', C-C', and D-D' of FIG. 12, respectively.

Each of the first source/drain patterns SD1 may include a first semiconductor layer SEL1 and a second semiconductor layer SEL2 on the first semiconductor layer SELL A sectional shape of the first source/drain pattern SD1 taken in the second direction D2 will be described with reference to FIG. 13A.

The first semiconductor layer SEL1 may be provided to cover an inner surface of the first recess RS1. The first semiconductor layer SEL1 may have a decreasing thickness in an upward direction. For example, the thickness of the first semiconductor layer SEL1, which is measured in the third direction D3 at the bottom level of the first recess RS1, may be larger than the thickness of the first semiconductor layer SEL1, which is measured in the second direction D2 at the top level of the first recess RS1. The first semiconductor layer SEL1 may have a 'U'-shaped section, due to a sectional profile of the first recess RS1.

The second semiconductor layer SEL2 may fill a remaining space of the first recess RS1 excluding the first semiconductor layer SELL A volume of the second semiconductor layer SEL2 may be larger than a volume of the first semiconductor layer SELL In other words, a ratio of the volume of the second semiconductor layer SEL2 to a total volume of the first source/drain pattern SD1 may be greater than a ratio of the volume of the first semiconductor layer SEL1 to the total volume of the first source/drain pattern SD1.

Each of the first and second semiconductor layers SEL1 and SEL2 may be formed of or include silicon-germanium (SiGe). In detail, the first semiconductor layer SEL1 may be provided to have a relatively low germanium concentration. In another embodiment, the first semiconductor layer SEL1 may contain only silicon (Si) but not germanium (Ge). The germanium concentration of the first semiconductor layer SEL1 may range from 0 at % to 10 at %.

The second semiconductor layer SEL2 may be provided to have a relatively high germanium concentration. As an example, the germanium concentration of the second semiconductor layer SEL2 may range from 30 at % to 70 at %. The germanium concentration of the second semiconductor layer SEL2 may increase in the third direction D3. For example, the germanium concentration of the second semiconductor layer SEL2 may be about 40 at % near the first semiconductor layer SEL1 but may be about 60 at % at its top level.

The first and second semiconductor layers SEL1 and SEL2 may include impurities (e.g., boron), allowing the first source/drain pattern SD1 to have the p-type conductivity. In an embodiment, a concentration of impurities in the second semiconductor layer SEL2 (in at %) may be higher than that in the first semiconductor layer SEL1.

The first semiconductor layer SEL1 may limit and/or prevent a stacking fault from occurring between the substrate SUB and the second semiconductor layer SEL2 and between the first to third semiconductor patterns SP1, SP2, and SP3 and the second semiconductor layer SEL2. The stacking fault may lead to an increase of a channel resistance. The stacking fault may easily occur on the bottom of the first recess RS1. Thus, to limit and/or prevent the stacking fault, the first semiconductor layer SEL1 may be provided to have a relatively large thickness near the bottom of the first recess RS1.

The first semiconductor layer SEL1 may protect the second semiconductor layer SEL2, during a process of replacing sacrificial layers SAL with first to third portions PO1, PO2, and PO3 of a gate electrode GE, which will be described below. For example, the first semiconductor layer SEL1 may limit and/or prevent the second semiconductor layer SEL2 from being undesirably etched by an etching material, which is used to remove the sacrificial layers SAL.

The gate electrodes GE may be provided to cross the first and second channel patterns CH1 and CH2 and to extend in the first direction D1. The gate electrodes GE may be arranged with a first pitch P1 in the second direction D2. Each of the gate electrodes GE may be vertically overlapped with the first and second channel patterns CH1 and CH2.

The gate electrode GE may include a first portion PO1 interposed between the active pattern AP1 or AP2 and the first semiconductor pattern SP1, a second portion PO2 interposed between the first semiconductor pattern SP1 and the second semiconductor pattern SP2, a third portion PO3 interposed between the second semiconductor pattern SP2 and the third semiconductor pattern SP3, and a fourth portion PO4 on the third semiconductor pattern SP3.

Referring back to FIG. 13A, the first to third portions PO1, PO2, and PO3 of the gate electrode GE on the PMOSFET region PR may have different widths from each other. For example, the largest width of the third portion PO3 in the second direction D2 may be larger than the largest width of the second portion PO2 in the second direction D2. The largest width of the first portion PO1 in the second direction D2 may be larger than the largest width of the third portion PO3 in the second direction D2.

Referring back to FIG. 13D, the gate electrode GE may be provided to face a top surface TS, a bottom surface BS, and opposite side surfaces SW of each of the first to third semiconductor patterns SP1, SP2, and SP3. That is, the transistor according to the present embodiment may be a three-dimensional field effect transistor (e.g., MBCFET or GAAFET) in which the gate electrode GE is provided to three-dimensionally surround the channel pattern.

Referring back to FIGS. 12 and 13A to 13D, a pair of gate spacers GS may be respectively disposed on opposite side surfaces of the fourth portion PO4 of the gate electrode GE. The gate spacers GS may be extended along the gate electrode GE and in the first direction D1. Top surfaces of the gate spacers GS may be higher than a top surface of the gate electrode GE. The top surfaces of the gate spacers GS may be coplanar with a top surface of a first interlayer insulating layer 110, which will be described below. The gate spacers GS may be formed of or include at least one of SiCN, SiCON, or SiN. In an embodiment, the gate spacers GS may have a multi-layered structure including at least two layers, each of which is made of SiCN, SiCON, or SiN.

A gate capping pattern GP may be provided on the gate electrode GE. The gate capping pattern GP may be extended along the gate electrode GE and in the first direction D1. The gate capping pattern GP may be formed of or include a material having an etch selectivity with respect to first and second interlayer insulating layers 110 and 120, which will be described below. In detail, the gate capping pattern GP may be formed of or include at least one of SiON, SiCN, SiCON, or SiN.

A gate insulating layer GI may be interposed between the gate electrode GE and the first channel pattern CH1 and between the gate electrode GE and the second channel pattern CH2. The gate insulating layer GI may cover the top surface TS, the bottom surface BS, and the opposite side surfaces SW of each of the first to third semiconductor patterns SP1, SP2, and SP3. The gate insulating layer GI may cover the top surface of the device isolation layer ST below the gate electrode GE (e.g., see FIG. 13D).

In an embodiment, the gate insulating layer GI may include a silicon oxide layer, a silicon oxynitride layer, and/or a high-k dielectric layer. The high-k dielectric layer may be formed of or include at least one of high-k dielectric materials whose dielectric constants are higher than that of silicon oxide. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

In another embodiment, the semiconductor device may include a negative capacitance (NC) FET using a negative capacitor. For example, the gate insulating layer GI may include a ferroelectric layer exhibiting a ferroelectric property and a paraelectric layer exhibiting a paraelectric property.

The ferroelectric layer may have a negative capacitance, and the paraelectric layer may have a positive capacitance. In the case where two or more capacitors are connected in series and each capacitor has a positive capacitance, a total capacitance may be reduced to a value that is less than a capacitance of each of the capacitors. By contrast, in the case where at least one of serially-connected capacitors has a negative capacitance, a total capacitance of the serially-connected capacitors may have a positive value and may be greater than an absolute value of each capacitance.

In the case where a ferroelectric layer having a negative capacitance and a paraelectric layer having a positive capacitance are connected in series, a total capacitance of the serially-connected ferroelectric and paraelectric layers may be increased. Due to such an increase of the total capacitance, a transistor including the ferroelectric layer may have a subthreshold swing (SS), which is less than 60 mV/decade, at the room temperature.

The ferroelectric layer may have the ferroelectric property. The ferroelectric layer may be formed of or include at least one of, for example, hafnium oxide, hafnium zirconium oxide, barium strontium titanium oxide, barium titanium oxide, and/or lead zirconium titanium oxide. Here, the hafnium zirconium oxide may be hafnium oxide that is doped with zirconium (Zr). Alternatively, the hafnium zirconium oxide may be a compound composed of hafnium (Hf), zirconium (Zr), and/or oxygen (O).

The ferroelectric layer may further include dopants. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The kind of the dopants in the ferroelectric layer may vary depending on a ferroelectric material included in the ferroelectric layer.

In the case where the ferroelectric layer includes hafnium oxide, the dopants in the ferroelectric layer may include at least one of, for example, gadolinium (Gd), silicon (Si), zirconium (Zr), aluminum (Al), and/or yttrium (Y).

In the case where the dopants are aluminum (Al), a content of aluminum in the ferroelectric layer may range from 3 to 8 at % (atomic percentage). Here, the content of the dopants (e.g., aluminum atoms) may be a ratio of the number of aluminum atoms to the number of hafnium and aluminum atoms.

In the case where the dopants are silicon (Si), a content of silicon in the ferroelectric layer may range from 2 at % to 10 at %. In the case where the dopants are yttrium (Y), a content of yttrium in the ferroelectric layer may range from 2 at % to 10 at %. In the case where the dopants are gadolinium (Gd), a content of gadolinium in the ferroelectric layer may range from 1 at % to 7 at %. In the case where the dopants are zirconium (Zr), a content of zirconium in the ferroelectric layer may range from 50 at % to 80 at %.

The paraelectric layer may have the paraelectric property. The paraelectric layer may be formed of or include at least one of, for example, silicon oxide and/or high-k metal oxides. The metal oxides, which can be used as the paraelectric layer, may include at least one of, for example, hafnium oxide, zirconium oxide, and/or aluminum oxide, but inventive concepts are not limited to these examples.

The ferroelectric layer and the paraelectric layer may be formed of or include the same material. The ferroelectric layer may have the ferroelectric property, but the paraelectric layer may not have the ferroelectric property. For example, in the case where the ferroelectric and paraelectric layers contain hafnium oxide, a crystal structure of the hafnium oxide in the ferroelectric layer may be different from a crystal structure of the hafnium oxide in the paraelectric layer.

The ferroelectric layer may exhibit the ferroelectric property, only when its thickness is in a specific range. In an embodiment, the ferroelectric layer may have a thickness ranging from 0.5 to 10 nm, but inventive concepts are not limited to this example. Since a critical thickness associated with the occurrence of the ferroelectric property varies depending on the kind of the ferroelectric material, the thickness of the ferroelectric layer may be changed depending on the kind of the ferroelectric material.

As an example, the gate insulating layer GI may include a single ferroelectric layer. As another example, the gate insulating layer GI may include a plurality of ferroelectric layers spaced apart from each other. The gate insulating layer GI may have a multi-layered structure, in which a plurality of ferroelectric layers and a plurality of paraelectric layers are alternately stacked.

In an embodiment, the gate electrode GE may include a first metal pattern and a second metal pattern on the first metal pattern. The first metal pattern may be provided on the gate insulating layer GI and may be adjacent to the first to third semiconductor patterns SP1, SP2, and SP3. The first metal pattern may include a work-function metal, which can be used to adjust a threshold voltage of the transistor. By adjusting a thickness and composition of the first metal pattern, it may be possible to realize a transistor having a desired threshold voltage.

For example, the first to third portions PO1, PO2, and PO3 of the gate electrode GE may be composed of the first metal pattern or the work-function metal.

The first metal pattern may include a metal nitride layer. For example, the first metal pattern may be formed of or include at least one metallic material, which is selected from the group consisting of titanium (Ti), tantalum (Ta), aluminum (Al), tungsten (W) and molybdenum (Mo), and nitrogen (N). In an embodiment, the first metal pattern may further include carbon (C). The first metal pattern may include a plurality of stacked work-function metal layers.

The second metal pattern may be formed of or include a metallic material whose resistance is lower than the first metal pattern. For example, the second metal pattern may be formed of or include at least one metallic material, which is selected from the group consisting of tungsten (W), aluminum (Al), titanium (Ti), and tantalum (Ta). In an embodiment, the fourth portion PO4 of the gate electrode GE may include the first metal pattern and the second metal pattern on the first metal pattern.

Referring back to FIG. 13B, inner spacers IP may be provided on the NMOSFET region NR. The inner spacers IP may be respectively interposed between the first to third portions PO1, PO2, and PO3 of the gate electrode GE and the second source/drain pattern SD2. The inner spacers IP may be in direct contact with the second source/drain pattern SD2. Each of the first to third portions PO1, PO2, and PO3 of the gate electrode GE may be spaced apart from the second source/drain pattern SD2 by the inner spacer IP.

A first interlayer insulating layer 110 may be provided on the substrate SUB. The first interlayer insulating layer 110 may cover the gate spacers GS and the first and second source/drain patterns SD1 and SD2. The first interlayer insulating layer 110 may have a top surface that is substantially coplanar with the top surface of the gate capping pattern GP and the top surface of the gate spacer GS. A second interlayer insulating layer 120 may be provided on the first interlayer insulating layer 110 to cover the gate capping pattern GP. In an embodiment, at least one of the first and second interlayer insulating layers 110 and 120 may include a silicon oxide layer.

A pair of dividing structures DB, which are opposite to each other in the second direction D2, may be provided at both sides of the logic cell LC. For example, the division structure DB may be provided on a border of the logic cell LC. The division structure DB may be extended in the first direction D1 to be parallel to the gate electrodes GE. A pitch between the dividing structure DB and the gate electrode GE, which are adjacent to each other, may be equal to the first pitch P1.

The division structure DB may be provided to penetrate the first and second interlayer insulating layers 110 and 120 and may be extended into the first and second active patterns AP1 and AP2. The division structure DB may penetrate the first and second channel patterns CH1 and CH2. The division structure DB may separate the PMOSFET and NMOSFET regions PR and NR of one logic cell LC from the PMOSFET and NMOSFET regions PR and NR of another logic cell LC.

Active contacts AC may be provided to penetrate the first and second interlayer insulating layers 110 and 120 and may be electrically connected to the first and second source/drain patterns SD1 and SD2, respectively. A pair of the active contacts AC may be respectively provided at both sides of the gate electrode GE. When viewed in a plan view, the active contact AC may be a bar-shaped pattern elongated in the first direction D1.

The active contact AC may be a self-aligned contact. For example, the active contact AC may be formed by a self-alignment process using the gate capping pattern GP and the gate spacer GS. In an embodiment, the active contact AC may cover at least a portion of a side surface of the gate spacer GS. Although not shown, the active contact AC may cover a portion of the top surface of the gate capping pattern GP.

Silicide patterns SC may be respectively interposed between the active contact AC and the first source/drain pattern SD1 and between the active contact AC and the second source/drain pattern SD2. The active contact AC may be electrically connected to the source/drain pattern SD1 or SD2 through the silicide pattern SC. The silicide pattern SC may be formed of or include at least one of metal silicide materials (e.g., titanium silicide, tantalum silicide, tungsten silicide, nickel silicide, and cobalt silicide).

Figure 13B:
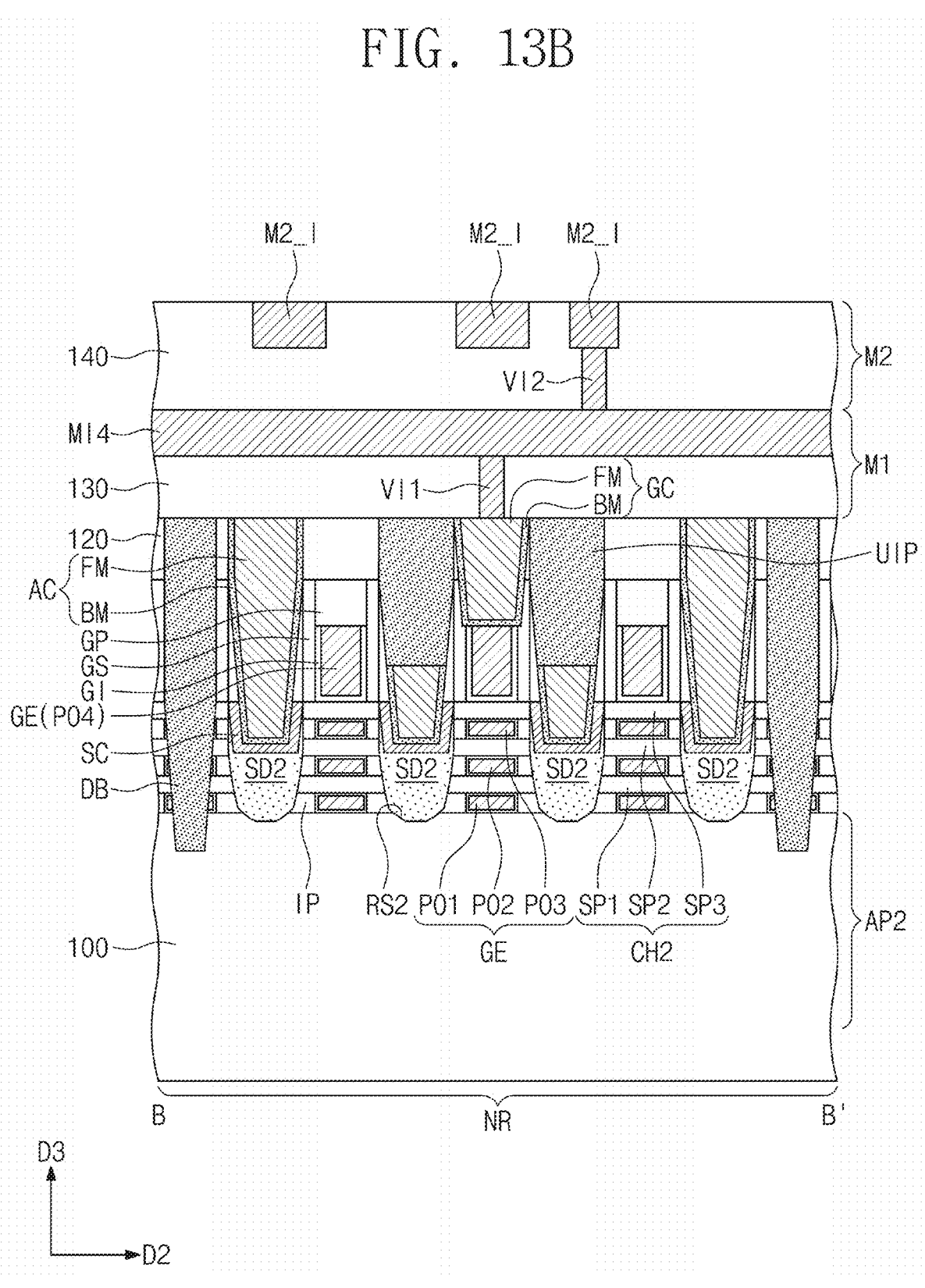
Figure 13C:
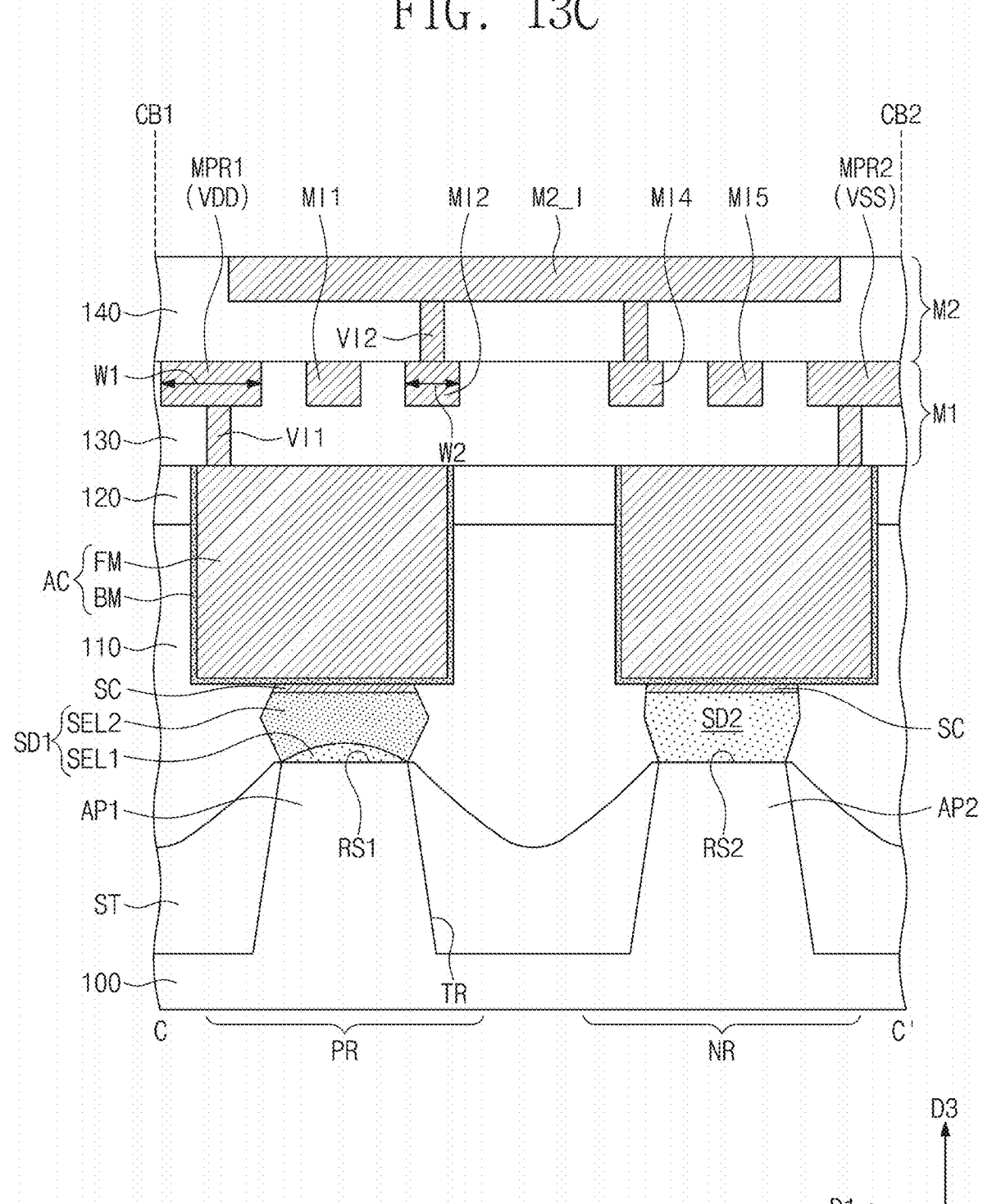
Figure 13D:

A gate contact GC may be provided to penetrate the second interlayer insulating layer 120 and the gate capping pattern GP and may be electrically connected to the gate electrode GE. As shown in FIG. 13B, an upper region of each of the active contacts AC adjacent to the gate contact GC may be filled with an upper insulating pattern UIP. Accordingly, it may be possible to limit and/or prevent a process failure (e.g., a short circuit), which may occur when the gate contact GC is in contact with the active contact AC adjacent thereto.

Each of the active and gate contacts AC and GC may include a conductive pattern FM and a barrier pattern BM enclosing the conductive pattern FM. For example, the conductive pattern FM may be formed of or include at least one metal of aluminum, copper, tungsten, molybdenum, or cobalt. The barrier pattern BM may be provided to cover side and bottom surfaces of the conductive pattern FM. In an embodiment, the barrier pattern BM may include a metal layer and a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CoN), or platinum nitride (PtN).

A first metal layer M1 may be provided in a third interlayer insulating layer 130. The first metal layer M1 may include first and second power lines MPR1 and MPR2, first to fifth lower interconnection lines MI1 to MI5, and lower vias VI1. The lower vias VI1 may be provided below the first and second power lines MPR1 and MPR2 and the first to fifth lower interconnection lines MI1 to MI5.

The first and second power lines MPR1 and MPR2 may be extended in the second direction D2 to cross the logic cell LC and to be parallel to each other. A drain voltage VDD and a source voltage VSS may be applied to the first and second power lines MPR1 and MPR2, respectively.

Referring to FIG. 12, a first cell boundary CB1, which is extended in the second direction D2, may be defined in the logic cell LC. A second cell boundary CB2, which is extended in the second direction D2, may be defined at an opposite side of the first cell boundary CB1. The first power line MPR1 applied with the drain voltage VDD may be disposed on the first cell boundary CB1. In other words, the first power line MPR1 applied with the drain voltage VDD may be extended along the first cell boundary CB1 or in the second direction D2. The second power line MPR2 applied with the source voltage VSS (e.g., a ground voltage) may be disposed on the second cell boundary CB2. In other words, the second power line MPR2 applied with the source voltage VSS may be extended along the second cell boundary CB2 or in the second direction D2.

The first to fifth lower interconnection lines MI1 to MI5 may be disposed between the first and second power lines MPR1 and MPR2. In detail, first to fifth interconnection tracks MTR1 to MTR5 may be defined between the first and second power lines MPR1 and MPR2. The first to fifth interconnection tracks MTR1 to MTR5 may be extended in the second direction D2 to be parallel to each other. The first to fifth lower interconnection lines MI1 to MI5 may be arranged with a second pitch P2 in the first direction D1. The second pitch P2 may be smaller than the first pitch P1.

At least one of the first lower interconnection lines MI1 may be disposed on the first interconnection track MTR1, at least one of the second lower interconnection lines MI2 may be disposed on the second interconnection track MTR2, at least one of the third lower interconnection lines MI3 may be disposed on the third interconnection track MTR3, at least one of the fourth lower interconnection lines MI4 may be disposed on the fourth interconnection track MTR4, and at least one of the fifth lower interconnection lines MI5 may be disposed on the fifth interconnection track MTR5.

The first to fifth lower interconnection lines MI1 to MI5 may be extended along the first to fifth interconnection tracks MTR1-MTR5, respectively, or in the second direction D2 and may be parallel to each other. When viewed in a plan view, each of the first to fifth lower interconnection lines MI1 to MI5 may be a line- or bar-shaped pattern.

A linewidth of each of the first and second power lines MPR1 and MPR2 may be a first width W1. A linewidth of each of the first to fifth lower interconnection lines MI1 to MI5 may be a second width W2. The second width W2 may be smaller than the first width W1 (e.g., see FIG. 13C). For example, the second width W2 may be smaller than 12 nm. The first width W1 may be larger than 12 nm.

The lower vias VI may be interposed between the first and second power lines PIL1 and PIL2 and the active contacts AC. The lower vias VI1 may be interposed between the first to fifth lower interconnection lines MI1 to MI5 and the active and gate contacts AC and GC.

For example, the first and second power lines MPR1 and MPR2 and the first to fifth lower interconnection lines MI1 to MI5 may be formed of or include at least one of metallic materials (e.g., copper (Cu), aluminum (Al), ruthenium (Ru), cobalt (Co), tungsten (W), and molybdenum (Mo)).

The interconnection lines MPR1, MPR2, and MI1 to MI5 of the first metal layer M1 and the lower vias VI1 thereunder may be formed by separate processes, respectively. In an embodiment, each of the interconnection lines MPR1, MPR2, and MI1 to MI5 and the lower via VI1 of the first metal layer M1 may be formed by a single damascene process.

Alternatively, each of the interconnection lines MPR1, MPR2, and MI1 to MI5 and the lower via VI1 of the first metal layer M1 may be formed through a metal etching process. The semiconductor device according to the present embodiment may be fabricated using a sub-20 nm process.

In an embodiment, the interconnection lines MPR1, MPR2, and MI1 to MI5 of the first metal layer M1 may be formed by the method of forming a target pattern, previously described with reference to FIGS. 2 to 8. In other words, the interconnection lines MPR1, MPR2, and MI1 to MI5 of the first metal layer M1 may be the target pattern TGP of FIG. 8 and may be patterns which are formed by the afore-described EUV lithography process or using the afore-described EUV lithography system.

A second metal layer M2 may be provided in a fourth interlayer insulating layer 140. The second metal layer M2 may include upper interconnection lines M2_I. Each of the upper interconnection lines M2_I may be a line- or bar-shaped pattern extending in the first direction D1. In other words, the upper interconnection lines M2_I may be extended in the first direction D1 to be parallel to each other.

The second metal layer M2 may further include upper vias VI2. The upper vias VI2 may be provided below the upper interconnection lines M2_I. The upper vias VI2 may be interposed between the interconnection lines MPR1, MPR2, and MI1 to MI5 of the first metal layer M1 and the upper interconnection lines M23, respectively.

In an embodiment, the upper interconnection line M2_I of the second metal layer M2 and the upper via VI2 thereunder may be a single object which is formed by the same process. For example, the upper interconnection line M2_I and the upper via VI2 of the second metal layer M2 may be formed through a dual damascene process. Alternatively, the upper interconnection line M2_I of the second metal layer M2 and the upper via VI2 thereunder may be formed by a metal etching process. The upper interconnection lines M2_I may be formed of or include at least one of metallic materials (e.g., copper (Cu), aluminum (Al), ruthenium (Ru), cobalt (Co), tungsten (W), and molybdenum (Mo)).

In an embodiment, although not shown, additional metal layers (e.g., M3, M4, M5, and so forth) may be further stacked on the fourth interlayer insulating layer 140. Each of the stacked metal layers may include interconnection lines.

Figure 14:
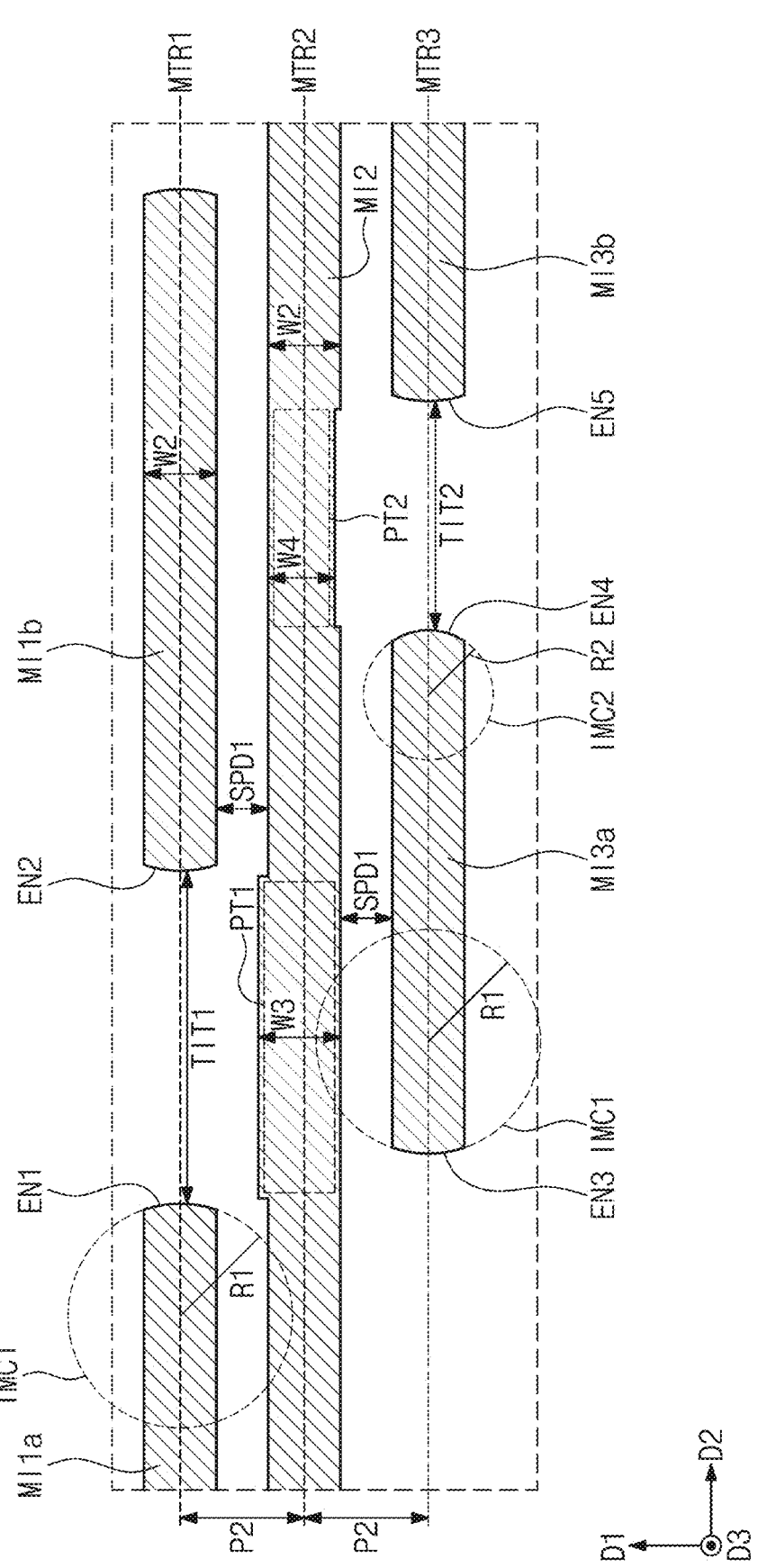
FIG. 14 is a plan view illustrating first to third lower interconnection lines, which are respectively disposed in first to third interconnection tracks of FIG. 12.

FIG. 14 is a plan view illustrating first to third lower interconnection lines, which are respectively disposed in first to third interconnection tracks of FIG. 12. The first to third lower interconnection lines MI1, MI2, and MI3 of FIG. 14 may be patterns which are formed by the afore-described EUV lithography process or using the afore-described EUV lithography system.

Referring to FIG. 14, the first lower interconnection lines MI1 placed on the first interconnection track MTR1 may include a first interconnection line MI1a and a second interconnection line MI1b. The first interconnection line MI1a may have a first end EN1 provided at its tip, and the second interconnection line MI1b may have a second end EN2 provided at its tip. The first end EN1 of the first interconnection line MI1a and the second end EN2 of the second interconnection line MI1b may face each other in the second direction D2.

A distance between the first end EN1 of the first interconnection line MI1a and the second end EN2 of the second interconnection line MI1b may be a first distance TIT1. The first distance TIT1 may be a distance between the tip of the first interconnection line MI1a and the tip of the second interconnection line MI1b (e.g., a tip-to-tip distance). The first distance TIT1 may be relatively large. For example, the first distance TIT1 may be larger than a second distance TIT2, which will be described below.

Each of the first end EN1 of the first interconnection line MI1a and the second end EN2 of the second interconnection line MI1b may have a curved shape. Each of the first end EN1 of the first interconnection line MI1a and the second end EN2 of the second interconnection line MI1b may have a relatively small curvature. In an embodiment, a first imaginary circle IMC1 may be defined to be in contact with the first end EN1 of the first interconnection line MI1a. The first imaginary circle IMC1 may include an arc corresponding to the first end EN1. In other words, the first imaginary circle IMC1 may be a circle that is best fitted to the curved shape of the first end EN1. The first imaginary circle IMC1 may have a first radius R1. The first radius R1 may be a curvature radius of the first end EN1 of the first interconnection line MI1a.

In the present specification, the curvature will be defined as a reciprocal of a curvature radius. The first end EN1 of the first interconnection line MI1a may have a relatively small curvature and may have a relatively large curvature radius (hereinafter, a first curvature radius R1). In an embodiment, the first curvature radius R1 of the first end EN1 of the first interconnection line MI1a may be larger than a linewidth W2 of the first interconnection line MI1a. A ratio of the first curvature radius R1 to the linewidth W2 may range from 1.1 to 4. The second end EN2 of the second interconnection line MI1b may have substantially the same curvature and curvature radius as the first end EN1 of the first interconnection line MI1a.

The third lower interconnection lines MI3, which are placed on the third interconnection track MTR3, may include a third interconnection line MI3a and a fourth interconnection line MI3b. The third interconnection line MI3a may have a third end EN3 and a fourth end EN4, which are respectively provided at its opposite tips. The fourth interconnection line MI3b may have a fifth end EN5 provided at its tip. The fourth end EN4 of the third interconnection line MI3a and the fifth end EN5 of the fourth interconnection line MI3b may face each other in the second direction D2.

A distance between the fourth end EN4 of the third interconnection line MI3a and the fifth end EN5 of the fourth interconnection line MI3b may be a second distance TIT2. The second distance TIT2 may be a distance between the tip of the third interconnection line MI3a and the tip of the fourth interconnection line MI3b. The second distance TIT2 may be relatively small. The second distance TIT2 may be smaller than the first distance TIT1.

The second distance TIT2 may be the smallest tip-to-tip distance, which can be realized by the EUV lithography process according to an embodiment of inventive concepts.

For example, the second distance TIT2 may range from 10 nm to 30 nm. In an embodiment, the second distance TIT2 may be about 24 nm.

According to an embodiment of inventive concepts, since, as described with reference to FIG. 2, the blocking layer BLL is provided below the metallic photoresist layer PRL, it may be possible to limit and/or prevent a process defect which may occur in a process of forming a target pattern using the EUV lithography technique. Accordingly, it may be possible to stably form interconnection lines, in which the smallest tip-to-tip distance is about 24 nm.

Furthermore, since the photoresist layer PRL for the EUV process according to an embodiment of inventive concepts includes the metallic photoresist, it may be possible to reduce the smallest distance between tips, compared with the case using the chemically amplified resist (CAR) as the photoresist layer PRL. Accordingly, a very small distance (e.g., about 24 nm or the second distance TIT2 between the fourth end EN4 of the third interconnection line MI3a and the fifth end EN5 of the fourth interconnection line MI3b) may be realized by only a single EUV lithography process, without an additional cutting process. Thus, it may be possible to simplify the fabrication process and to improve the efficiency in the fabrication process.

Each of the fourth end EN4 of the third interconnection line MI3a and the fifth end EN5 of the fourth interconnection line MI3b may have a curved shape. The third end EN3 of the third interconnection line MI3a may have substantially the same curvature as the first end EN1 of the first interconnection line MI1a. That is, a curvature radius of the third end EN3 of the third interconnection line MI3a may be the first radius R1.

The fifth end EN5 of the third interconnection line MI3a may have a curvature larger than the third end EN3. In the present embodiment, opposite ends of at least one of the interconnection lines may have different curvatures from each other. The fifth end EN5 of the third interconnection line MI3a may have a curvature larger than the first end EN1 of the first interconnection line MI1a.

In an embodiment, a second imaginary circle IMC2 may be defined to be in contact with the fourth end EN4 of the third interconnection line MI3a. The second imaginary circle IMC2 may include an arc corresponding to the fourth end EN4. The second imaginary circle IMC2 may have a second radius R2. The second radius R2 may be a curvature radius of the fourth end EN4 of the third interconnection line MI3a. The second radius R2 may be smaller than the first radius R1. Accordingly, the fourth end EN4 of the third interconnection line MI3a may have a curvature larger than the third end EN3.

As an example, the second curvature radius R2 of the fourth end EN4 of the third interconnection line MI3a may be larger than the linewidth W2 of the third interconnection line MI3a. A ratio of the second curvature radius R2 to the linewidth W2 may range from 1.1 to 2. The second curvature radius R2 of the fourth end EN4 of the third interconnection line MI3a may be smaller than the first curvature radius R1 of the first end EN1 of the first interconnection line MI1a. The fifth end EN5 of the fourth interconnection line MI3b may have substantially the same curvature and curvature radius as the fourth end EN4 of the third interconnection line MI1a.

According to an embodiment of inventive concepts, the curvature of the tip of the interconnection line may vary depending on a tip-to-tip distance between the interconnection lines disposed on each interconnection track. For example, in the case where a distance between the interconnection lines is relatively large (e.g., the distance TIT1 between the first and second interconnection lines MI1a and MI1b), the corresponding tips EN1 and EN2 may have a relatively small curvature. By contrast, in the case where a distance between the interconnection lines is relatively small (e.g., the distance TIT2 between the third and fourth interconnection lines MI3a and MI3b), the corresponding tips EN4 and EN5 may have a relatively large curvature.

According to an embodiment of inventive concepts, the interconnection lines may be formed by an EUV lithography process using a single photomask. In this case, due to the interference of the EUV light, the smaller the tip-to-tip distance between the interconnection lines, the larger the curvature of the tip. Nevertheless, due to the very high resolution of the EUV light, for a very small tip-to-tip distance (e.g., the second distance TIT2), the curvature radius R2 of the fourth and fifth ends EN4 and EN5 may be larger than the linewidth W2.

According to an embodiment of inventive concepts, since interconnection lines are formed using a single EUV photomask, not by a multi-patterning technology, interconnection lines on the same track may be accurately aligned to the track. For example, each of the first and second interconnection lines MI1a and MI1b may be aligned such that a center thereof is accurately placed on the first interconnection track MTR1. Similarly, each of the third and fourth interconnection lines MI3a and MI3b may be aligned such that a center thereof is accurately placed on the third interconnection track MTR3.

The first to fourth interconnection lines MI1a, MI1b, MI3a, and MI3b described above may have the same linewidth (e.g., the linewidth W2). Each of the first to fourth interconnection lines MI1a, MI1b, MI3a, and MI3b may be extended in the second direction D2 without a change in its linewidth (e.g., the linewidth W2). The linewidth W2 of each of the first to fourth interconnection lines MI1a, MI1b, MI3a, and MI3b may be decreased but may not be increased, at a corresponding end EN1, EN2, EN3, EN4, or EN5.

The second lower interconnection line MI2 may be provided on the second interconnection track MTR2, which is located between the first and third interconnection tracks MTR1 and MTR3. For example, the second lower interconnection line MI2 may be interposed between the first lower interconnection line MI1 and the third lower interconnection line MI3.

A pitch P2 between the first and second lower interconnection lines MI1 and MI2 may be substantially equal to a pitch P2 between the third and second lower interconnection lines MI3 and MI2. A distance SPD 1 between the first and second lower interconnection lines MI1 and MI2 may be substantially equal to the distance SPD 1 between the third and second lower interconnection lines MI3 and MI2.

The linewidth of the second lower interconnection line MI2 may be substantially equal to the linewidth W2 of each of the first to fourth interconnection lines MI1a, MI1b, MI3a, and MI3b. However, at least a portion of the second lower interconnection line MI2 may have a linewidth that is slightly larger or smaller than the second width W2.

In detail, the second lower interconnection line MI2 may include a first portion PT1 and a second portion PT2. The first portion PT1 may be a portion of the second lower interconnection line MI2 that is located near a region between the first end EN1 of the first interconnection line MI1a and the second end EN2 of the second interconnection line MI1b. The second portion PT2 may be another portion of the second lower interconnection line MI2 that is located near a region between the fourth end EN4 of the third interconnection line MI3*a* and the fifth end EN5 of the fourth interconnection line MI3*b*.

In an embodiment, the first portion PT1 may have a third width W3 larger than the second width W2. The second portion PT2 may have a fourth width W4 smaller than the second width W2. This is because of an optical interference phenomenon and the consequent pattern deformation, which may occur at an interconnection line, which is adjacent to a region between tips, when the interconnection lines are formed using a single EUV photomask. Accordingly, at least one of the width W3 of the first portion PT1 and the width W4 of the second portion PT2 may be different from a mean value of the linewidth W2 of the second lower interconnection line MI2.

Figure 15:
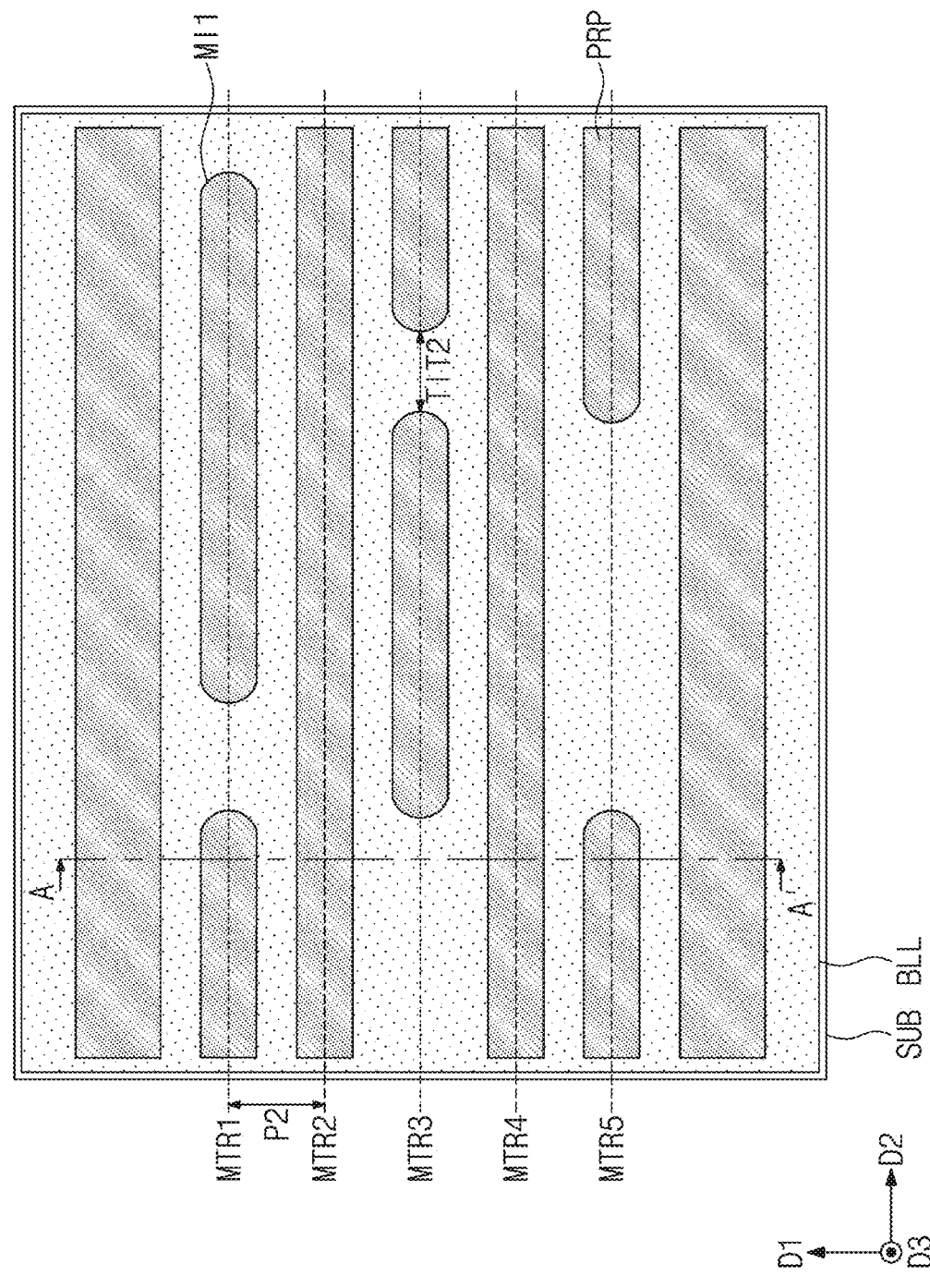
FIGS. 15 and 17 are plan views illustrating a method of fabricating a first metal layer, according to an embodiment of inventive concepts.
Figure 16:
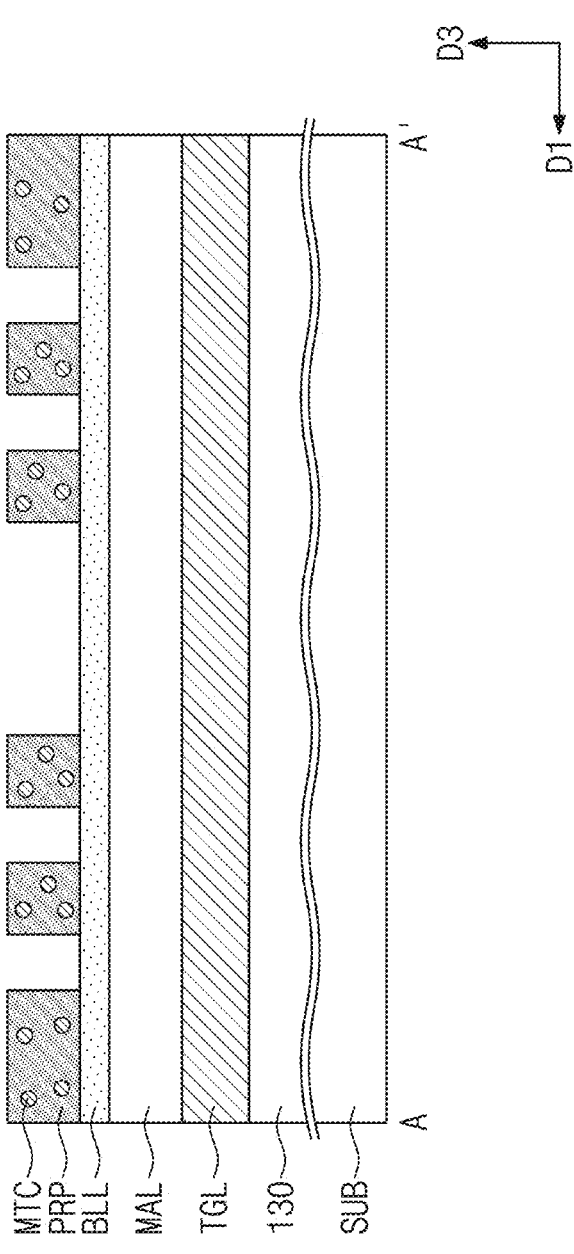
Figure 17:
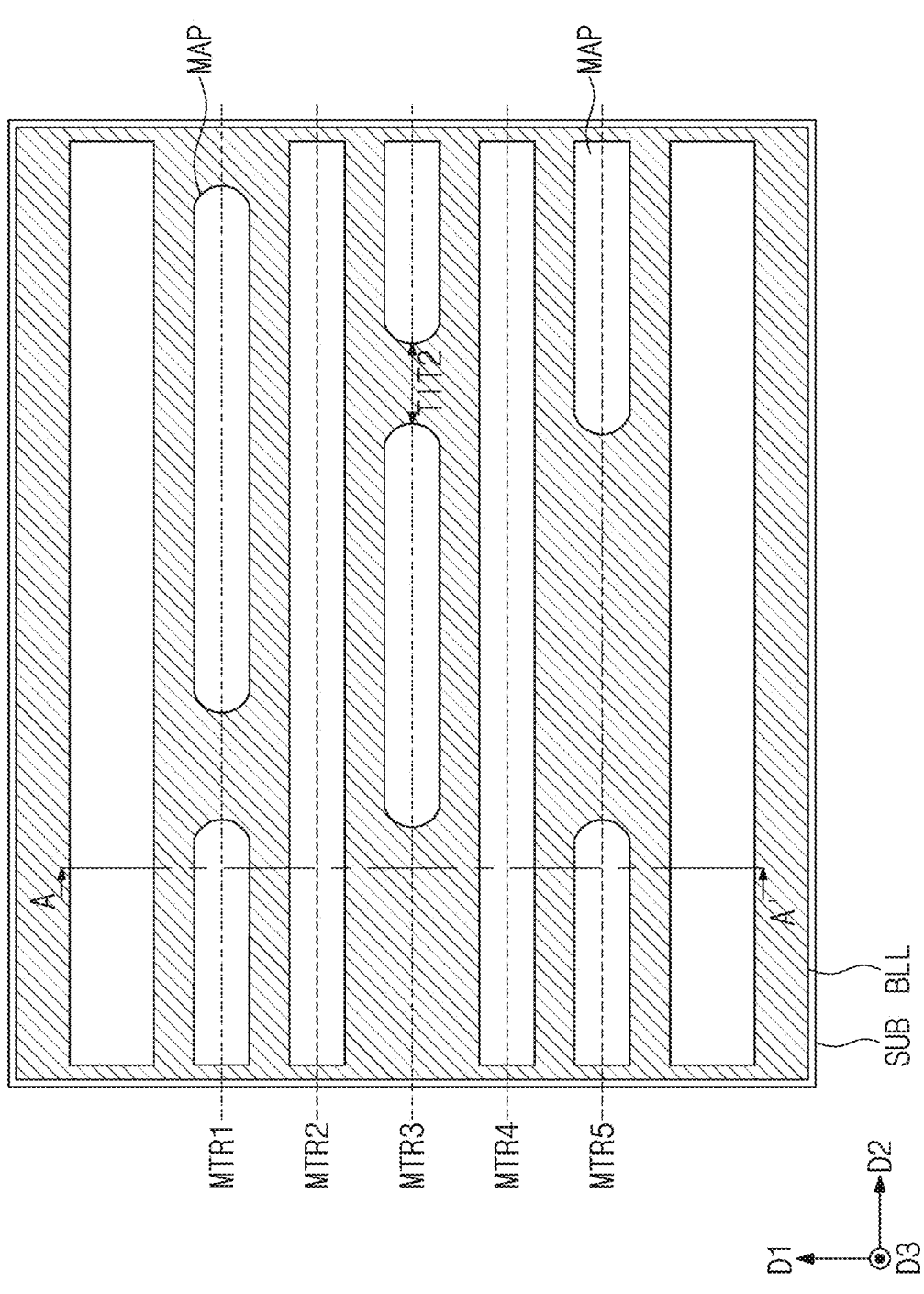
Figure 18:
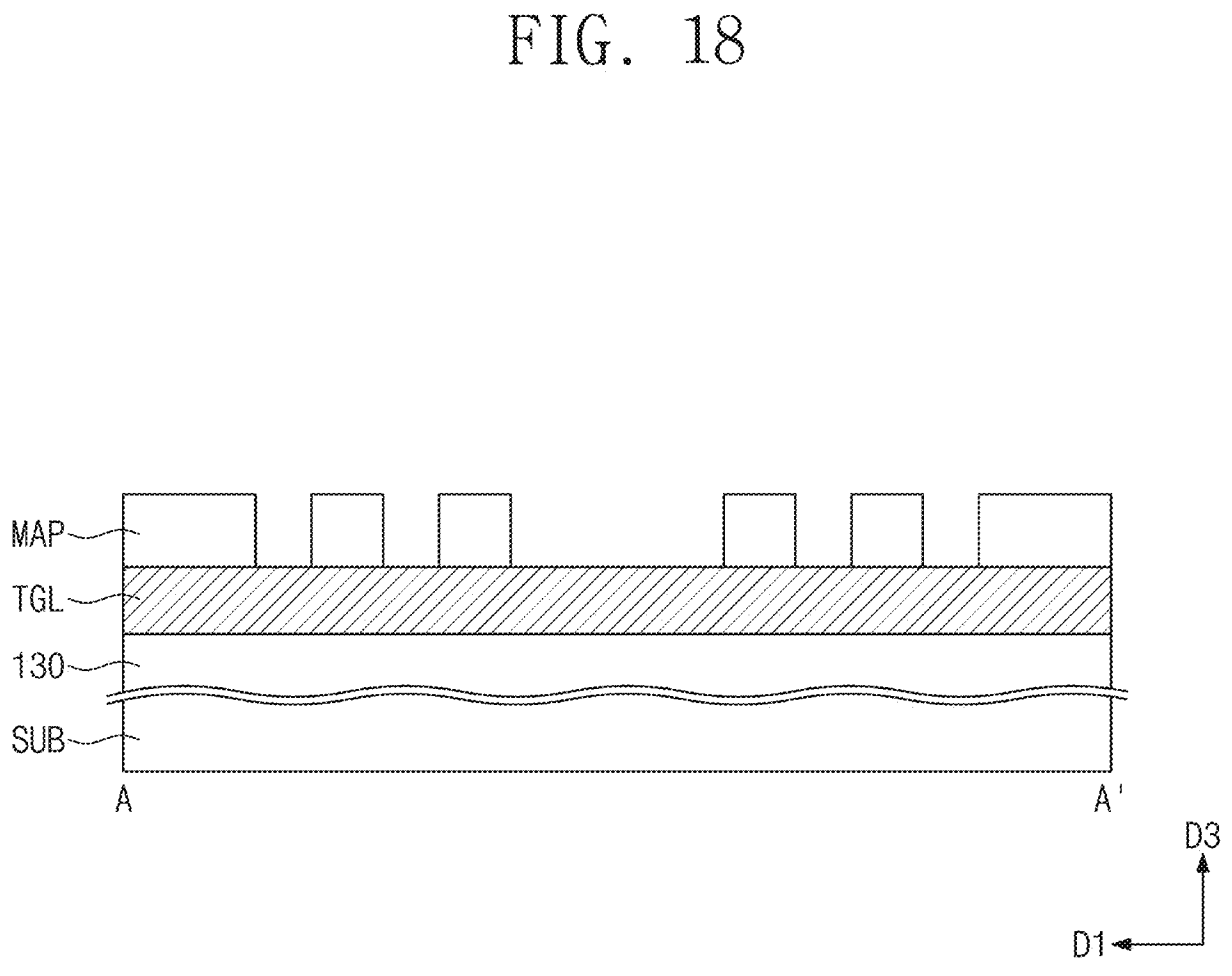

FIGS. 15 and 17 are plan views illustrating a method of fabricating a first metal layer, according to an embodiment of inventive concepts. FIGS. 16 and 18 are sectional views taken along lines A-A' of FIGS. 15 and 17, respectively.

Referring to FIGS. 15 and 16, an FEOL layer may be formed on the substrate SUB. The FEOL layer may include the logic transistors previously described with reference to FIGS. 12 and 13A to 13D. The third interlayer insulating layer 130 may be formed on the FEOL layer. The etch-target layer TGL may be formed on the third interlayer insulating layer 130. The etch-target layer TGL may be a metal layer and may be formed of or include at least one of metallic materials (e.g., copper (Cu), aluminum (Al), ruthenium (Ru), cobalt (Co), tungsten (W), and molybdenum (Mo)). The mask layer MAL and the blocking layer BLL may be sequentially formed on the etch-target layer TGL. The mask layer MAL may be a single layer or may include a plurality of layers (e.g., MAL1, MAL2, MAL3), as previously described with reference to FIG. 2. The blocking layer BLL may be a non-polar layer, as described above.

The photoresist patterns PRP may be formed on the blocking layer BLL. The photoresist patterns PRP may be formed by exposing a metallic photoresist layer with EUV light and developing the metallic photoresist layer. In an embodiment, the photoresist patterns PRP may be formed using a single EUV photomask. The photoresist patterns PRP may define interconnection lines, which will be formed in the first metal layer M1. The blocking layer BLL may limit and/or prevent the metallic element MTC in the photoresist patterns PRP from being infiltrated into the mask layer MAL.

According to the present embodiment, since the photoresist patterns PRP are formed using an EUV lithography process, a pitch P2 between the photoresist patterns PRP may have a very small value of 45 nm or smaller. In addition, the smallest distance TIT2 between tips may be within a range of 10 nm to 30 nm.

Referring to FIGS. 17 and 18, mask patterns MAP may be formed by etching the mask layer MAL using the photoresist patterns PRP as an etch mask. Since the mask patterns MAP are copied from the photoresist patterns PRP, the mask patterns MAP may have substantially the same planar shapes as the photoresist patterns PRP.

Referring back to FIGS. 12 and 13A to 13D, the interconnection lines MPR1, MPR2, and MI1 to MI5 may be formed by etching the etch-target layer TGL using the mask patterns MAP as an etch mask. In an embodiment, the interconnection lines MPR1, MPR2, and MI1 to MI5 may be directly formed by etching the etch-target layer TGL, which is the metal layer, using the mask patterns MAP. In another embodiment, in the case where the etch-target layer TGL is an insulating layer, the interconnection lines MPR1, MPR2, and MI1 to MI5 may be formed by etching the etch-target layer TGL using the mask patterns MAP and filling the etched portions with a metal layer.

In a method of fabricating a semiconductor device according to an embodiment of inventive concepts, an organic metal oxide layer, which has high absorptivity to EUV light and can be formed to have a small thickness, may be used as a resist for an EUV lithography process. According to an embodiment of inventive concepts, since a non-polar blocking layer is formed below a photoresist layer, it may be possible to effectively limit and/or prevent a metallic element in the photoresist layer from being diffused into a mask layer. According to an embodiment of inventive concepts, a silicon capping layer may be selectively formed on a photoresist pattern, and thus, it may be possible to effectively protect the thin photoresist pattern. As a result, it may be possible to realize a highly-reliable EUV lithography process and to reduce a pitch and distance between patterns formed on a substrate.

While example embodiments of inventive concepts have been particularly shown and described, it will be understood by one of ordinary skill in the art that variations in form and detail may be made therein without departing from the spirit and scope of inventive concepts in the attached claims.

What is claimed is:

1. A method of forming a target pattern, the method comprising:

forming an etch-target layer, a mask layer, a blocking layer, an under layer, and a photoresist layer, which are sequentially stacked on a substrate, the photoresist layer including an organic metal oxide having a metallic element, and the blocking layer being a non-polar layer configured to limit the metallic element of the organic metal oxide in the photoresist layer from infiltrating into the mask layer;

forming a photoresist pattern, the forming the photoresist pattern including irradiating the photoresist layer with extreme ultraviolet (EUV) light;

selectively forming a capping layer on a surface of the photoresist pattern such that the capping layer is not formed on an exposed surface of the under layer, the exposed surface of the under layer being exposed by the photoresist pattern and a part of the capping layer over the under layer such that the exposed surface of the under layer does not vertically overlap the capping layer, the selectively forming the capping layer on the surface of the photoresist pattern being performed through a deposition process in which a silicon precursor reacts selectively with the organic metal oxide originated from the photoresist layer that is on the surface of the photoresist pattern after the forming the photoresist pattern;

forming a mask pattern, the forming the mask pattern including etching the mask layer using the photoresist pattern as an etch mask; and etching the etch-target layer using the mask pattern as an etch mask.

2. The method of claim 1, wherein the blocking layer comprises SiC, amorphous silicon, SiOC, SiCH, or borophosphosilicate glass (BPSG).

3. The method of claim 2, wherein the blocking layer comprises SiC.

4. The method of claim 1, wherein the photoresist layer comprises organotin oxide, and the blocking layer is configured to limit tin (Sn) in the photoresist layer from infiltrating into the mask layer.

5. The method of claim 1, wherein
the mask layer comprises a first mask layer and a second mask layer,
the first mask layer comprises an amorphous carbon layer, and
the second mask layer comprises a silicon layer, a silicon oxide layer, a silicon nitride layer, or a silicon oxynitride layer.

6. The method of claim 1,
wherein the capping layer comprises silicon (Si).

7. The method of claim 6, wherein
the forming the capping layer comprises providing the silicon precursor on the surface of the photoresist pattern, and
the silicon precursor selectively reacts with the surface of the photoresist pattern to form a silicon layer on the surface of the photoresist pattern.

8. The method of claim 1, wherein
the target pattern comprises a first interconnection line and a second interconnection line, which are adjacent to each other, and
a smallest distance between a first end of the first interconnection line and a second end of the second interconnection line ranges from 10 nm to 30 nm.

9. The method of claim 8, wherein
a first curvature radius of the first end of the first interconnection line is larger than a linewidth of the first interconnection line,
the first interconnection line further comprises a third end that is opposite the first end, and
a second curvature radius of the third end is larger than the first curvature radius.

10. The method of claim 1, wherein
the substrate comprises an edge region and a center region,
the edge region is a peripheral region of the substrate and surrounds the center region of the substrate,
the edge region is adjacent to a sidewall of the substrate,
the edge region comprises the metallic element, which is diffused from the photoresist layer, and
a concentration of the metallic element in the edge region ranges from 1E9/cm3 to 1E11/cm$^3$.

11. The method of claim 1, wherein
the photoresist layer comprises organotin oxide as the organic metal oxide, and
the blocking layer comprises SiC, amorphous silicon, SiOC, SiCH, or borophosphosilicate glass (BPSG).

12. The method of claim 11, wherein
the mask layer comprises a first mask layer and a second mask layer,
the first mask layer comprises an amorphous carbon layer, and
the second mask layer comprises a silicon layer, a silicon oxide layer, a silicon nitride layer, or a silicon oxynitride layer.

13. The method of claim 11, wherein
the capping layer comprises silicon (Si),
the forming the capping layer comprises providing the silicon precursor on the surface of the photoresist pattern, and
the silicon precursor selectively reacts with the surface of the photoresist pattern to form a silicon layer on the surface of the photoresist pattern.

14. A method of forming a target pattern, the method comprising:
forming an etch-target layer, a mask layer, a blocking layer, an under layer, and a photoresist layer, which are sequentially stacked on a substrate,
the photoresist layer including an organic metal oxide;
forming a photoresist pattern, the forming the photoresist pattern including irradiating the photoresist layer with extreme ultraviolet (EUV) light;
forming a silicon layer on a surface of the photoresist pattern, the forming the silicon layer including providing a silicon precursor on the surface of the photoresist pattern, the silicon precursor selectively reacting with the surface of the photoresist pattern such that the silicon layer is formed selectively on the surface of the photoresist pattern and is not formed on an exposed surface of the under layer, the exposed surface of the under layer and a part of the silicon layer over the under layer such that the exposed surface of the under layer does not vertically overlap the silicon layer, the forming the silicon layer on the surface of the photoresist pattern being performed through a deposition process in which the silicon precursor reacts selectively with the organic metal oxide originated from the photoresist layer that is on the surface of the photoresist pattern after the forming the photoresist pattern;
etching the blocking layer using the photoresist pattern as an etch mask, the etching the blocking layer including removing the silicon layer;
forming another silicon layer on the surface of the photoresist pattern;
forming a mask pattern, the forming the mask pattern including etching the mask layer using the photoresist pattern as an etch mask; and
etching the etch-target layer using the mask pattern as an etch mask, wherein
the under layer is disposed between the blocking layer and the photoresist layer.

15. The method of claim 14, wherein
the silicon precursor comprises silicon tetrachloride.

16. The method of claim 14,
wherein the under layer comprises an organic polymer.

17. The method of claim 14, wherein
the blocking layer comprises SiC, amorphous silicon (Si), SiOC, SiCH, or borophosphosilicate glass (BPSG),
the organic metal oxide in the photoresist layer includes a metallic element,
the blocking layer is configured to limit the metallic element in the organic metal oxide of the photoresist layer from infiltrating into the mask layer.

18. The method of claim 14, wherein
the photoresist layer comprises organotin oxide as the organic metal oxide, and
the blocking layer comprises SiC, amorphous silicon, SiOC, SiCH, or borophosphosilicate glass (BPSG), and
the exposed surface of the under layer is a part of a top surface of the under layer that is exposed by the photoresist pattern and spaced apart from a sidewall of the photoresist pattern.

19. The method of claim 18, wherein
the silicon precursor comprises silicon tetrachloride, and
the under layer comprises an organic polymer.

* * * * *